(12) United States Patent
Lin et al.

(10) Patent No.: US 10,529,861 B2
(45) Date of Patent: Jan. 7, 2020

(54) FINFET STRUCTURES AND METHODS OF FORMING THE SAME

(71) Applicant: Taiwan Semiconductor Manufacturing Company, Ltd., Hsin-Chu (TW)

(72) Inventors: Yu-Chang Lin, Hsin-Chu (TW); Wei-Ting Chien, Hsin-Chu (TW); Chun-Feng Nieh, Hsin-Chu (TW); Wen-Li Chiu, Kaohsiung (TW); Huicheng Chang, Tainan (TW); Chun-Sheng Liang, Puyan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/356,439

(22) Filed: Nov. 18, 2016

(65) Prior Publication Data
US 2018/0145177 A1 May 24, 2018

(51) Int. Cl.
| | |
|---|---|
| *H01L 29/78* | (2006.01) |
| *H01L 29/66* | (2006.01) |
| *H01L 29/417* | (2006.01) |
| *H01L 29/16* | (2006.01) |
| *H01L 29/10* | (2006.01) |
| *H01L 21/3115* | (2006.01) |

(52) U.S. Cl.
CPC .... *H01L 29/7851* (2013.01); *H01L 21/31155* (2013.01); *H01L 29/1054* (2013.01); *H01L 29/16* (2013.01); *H01L 29/41758* (2013.01); *H01L 29/66795* (2013.01)

(58) Field of Classification Search
CPC ........... H01L 21/31155; H01L 29/7831; H01L 29/66545; H01L 29/401; H01L 29/02; H01L 29/7851; H01L 29/66795; H01L 29/7843; H01L 29/1054
See application file for complete search history.

(56) References Cited

U.S. PATENT DOCUMENTS

| | | |
|---|---|---|
| 7,667,271 B2 | 2/2010 | Yu et al. |
| 8,362,575 B2 | 1/2013 | Kwok et al. |
| 8,367,498 B2 | 2/2013 | Chang et al. |
| 8,440,517 B2 | 5/2013 | Lin et al. |
| 8,497,528 B2 | 7/2013 | Lee et al. |
| 8,610,240 B2 | 12/2013 | Lee et al. |
| 8,680,576 B2 | 3/2014 | Ching et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,785,285 B2 | 7/2014 | Tsai et al. |
| 8,796,759 B2 | 8/2014 | Perng et al. |

(Continued)

*Primary Examiner* — Marcos D. Pizarro
*Assistant Examiner* — Antonio B Crite
(74) *Attorney, Agent, or Firm* — Slater Matsil, LLP

(57) ABSTRACT

FinFET structures and methods of forming the same are disclosed. A device includes a semiconductor fin. A gate stack is on the semiconductor fin. The gate stack includes a gate dielectric on the semiconductor fin and a gate electrode on the gate dielectric. The gate electrode and the gate dielectric have top surfaces level with one another. A first inter-layer dielectric (ILD) is adjacent the gate stack over the semiconductor fin. The first ILD exerts a compressive strain on the gate stack.

20 Claims, 28 Drawing Sheets

(56) References Cited

U.S. PATENT DOCUMENTS

| | | |
|---|---|---|
| 8,809,139 B2 | 8/2014 | Huang et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 2006/0261416 A1* | 11/2006 | Hachimine ..... H01L 21/823412 257/369 |
| 2007/0141795 A1* | 6/2007 | Park .................... H01L 29/4983 438/294 |
| 2008/0203487 A1* | 8/2008 | Hohage ............ H01L 21/76801 257/369 |
| 2011/0068407 A1 | 3/2011 | Yeh et al. |
| 2013/0011983 A1 | 1/2013 | Tsai et al. |
| 2014/0252412 A1 | 9/2014 | Tsai et al. |
| 2015/0155383 A1* | 6/2015 | Chang ................ H01L 29/7843 257/401 |
| 2016/0035891 A1* | 2/2016 | Xu ...................... H01L 29/7843 257/288 |
| 2017/0040449 A1* | 2/2017 | Asenov ............. H01L 29/41775 |
| 2017/0110576 A1* | 4/2017 | Kim ..................... H01L 29/401 |

\* cited by examiner

FINFET STRUCTURES AND METHODS OF FORMING THE SAME

BACKGROUND

Semiconductor devices are used in a large number of electronic devices, such as computers, cell phones, and others. Semiconductor devices include integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, Fin Field-Effect Transistors (FinFETs) or multiple gate transistors are being researched and implemented. However, with this new device structure and the continuous shrinking of even FinFETs, new challenges are being discovered.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
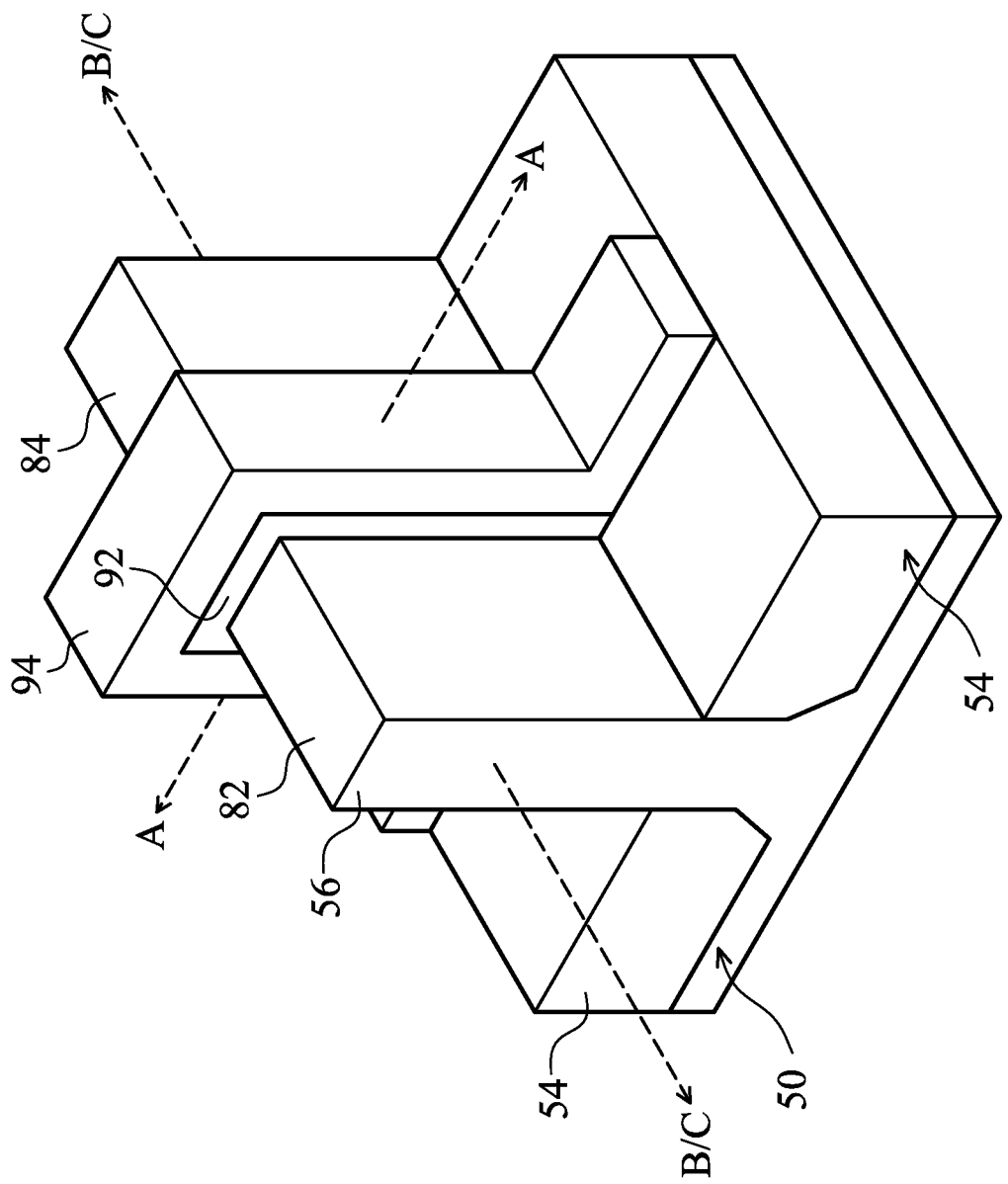
FIG. 1 is an example of a Fin Field-Effect Transistor (FinFET) in a three-dimensional view.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FinFETs and methods of forming the same are provided in accordance with various embodiments. In particular, a compressive strain is introduced on the gate stack of a FinFET. The compressive strain may be introduced by implanting the inter-layer dielectric (ILD) over and/or around the gate stack with a semiconductor impurity. The compressive strain may cause the gate stack to have a more uniform width across devices with multiple gates and FinFETs. For example, the width may be uniform across different regions of the device, such as Shallow Trench Isolation (STI) regions, active regions, etc. A more uniform gate width may improve the consistency of the critical dimension between the gate, source, and drain regions of FinFETs. As the critical dimensions of FinFETs continues to decrease, a more consistent critical dimension between the gate, source, and drain regions may reduce the overlay shift of a patterning process when metal contacts are formed for the FinFETs. Specifically, a more uniform gate width in the device may increase the photolithography processing window, reducing the risk of forming metal contacts that miss the gate, source, and/or drain regions, or short these regions together. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

FIG. 1 illustrates an example of a FinFET in a three-dimensional view. The FinFET comprises a fin 56 on a substrate 50. The substrate 50 includes isolation regions 54, and the fin 56 protrudes above and from between neighboring isolation regions 54. A gate dielectric 92 is along sidewalls and over a top surface of the fin 56, and a gate electrode 94 is over the gate dielectric 92. Source/drain regions 82 and 84 are disposed in opposite sides of the fin 56 with respect to the gate dielectric 92 and gate electrode 94. FIG. 1 further illustrates reference cross-sections that are used in later figures. Cross-section A-A is across a channel, gate dielectric 92, and gate electrode 94 of the FinFET. Cross-section B/C-B/C is perpendicular to cross-section A-A and is along a longitudinal axis of the fin 56 and in a direction of, for example, a current flow between the source/drain regions 82 and 84. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 17C are cross-sectional views of intermediate stages in the manufacturing of FinFETs in accordance with exemplary embodiments. FIGS. 2 through 6 illustrate reference cross-section A-A illustrated in FIG. 1, except for multiple FinFETs. In FIGS. 7A through 17C, figures ending with an "A" designation are illustrated along a similar cross-section A-A; figures ending with a "B" designation are illustrated along a similar cross-section B/C-B/C and in a first region on a substrate; and figures ending with a "C" designation are illustrated along a similar cross-section B/C-B/C and in a second region on a substrate.

Figure 2:
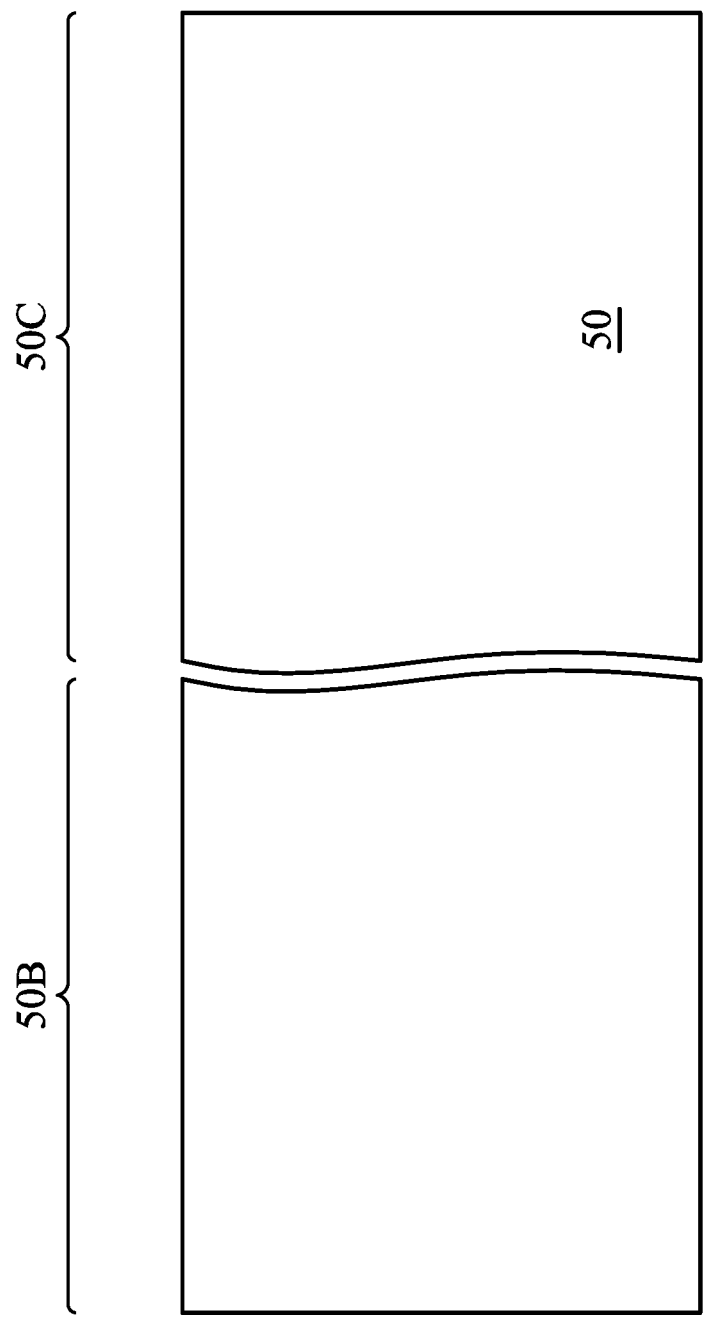
FIGS. 2 through 17C are cross-sectional views of intermediate stages in the manufacturing of FinFETs in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50B and a second region 50C. The first region 50B (which corresponds to subsequent figures ending in "B") can be for forming n-type devices, such as NMOS transistors, such as n-type FinFETs. The second region 50C (which corresponds to subsequent figures ending in "C") can be for forming p-type devices, such as PMOS transistors, such as p-type FinFETs.

Figure 3:
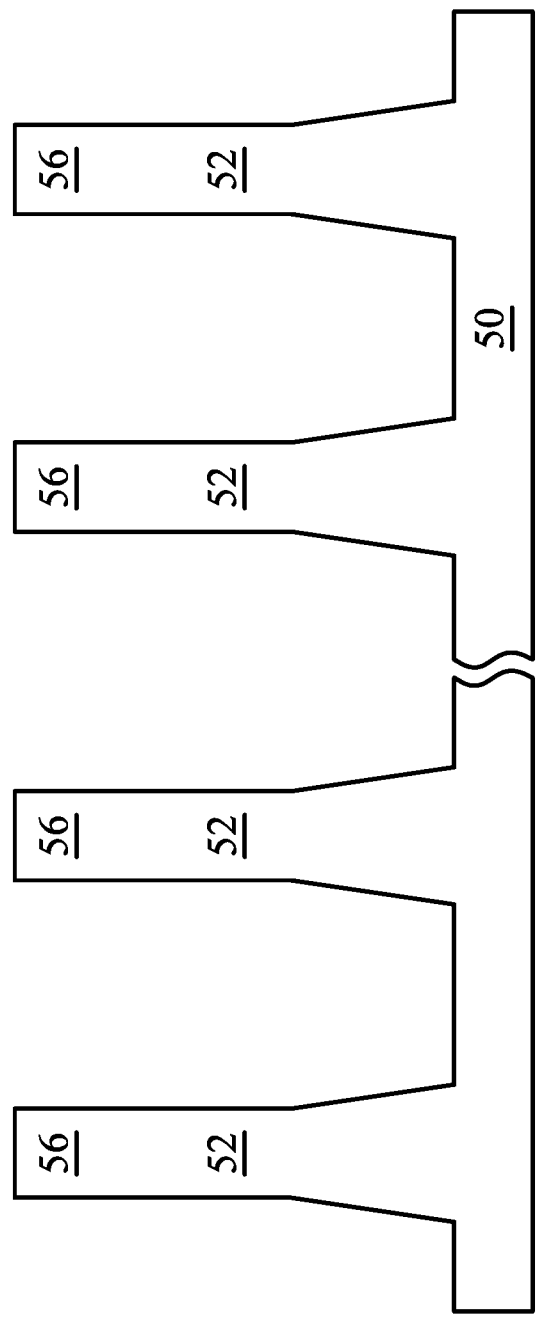
Figure 4:
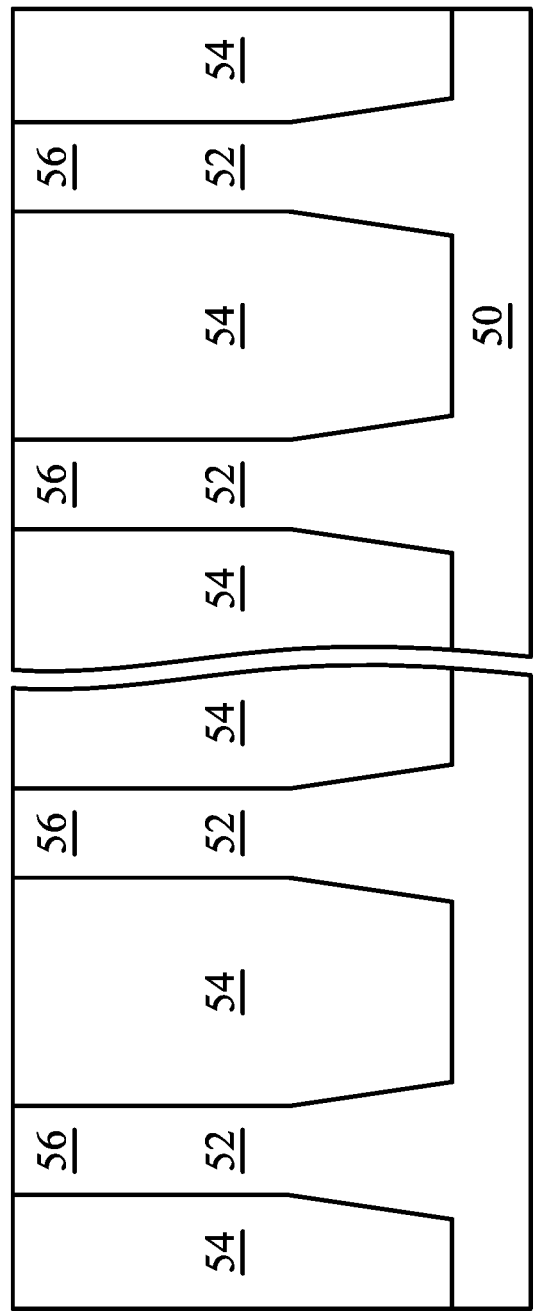

In FIGS. 3 and 4, fins 52 are formed and isolation regions 54 are formed between neighboring fins 52. In FIG. 3, the fins 52 are formed in the substrate 50. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

In FIG. 4, an insulation material 54 is formed between neighboring fins 52 to form the isolation regions 54. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. An anneal process may be performed once the insulation material is formed. In the illustrated embodiment, the insulation material 54 is silicon oxide formed by a FCVD process. The insulating material 54 may be referred to as isolation regions 54. Further in FIG. 4, a planarization process, such as a chemical mechanical polish (CMP), may remove any excess insulation material 54 and form top surfaces of the isolation regions 54 and top surfaces of the fins 52 that are coplanar.

Figure 5:
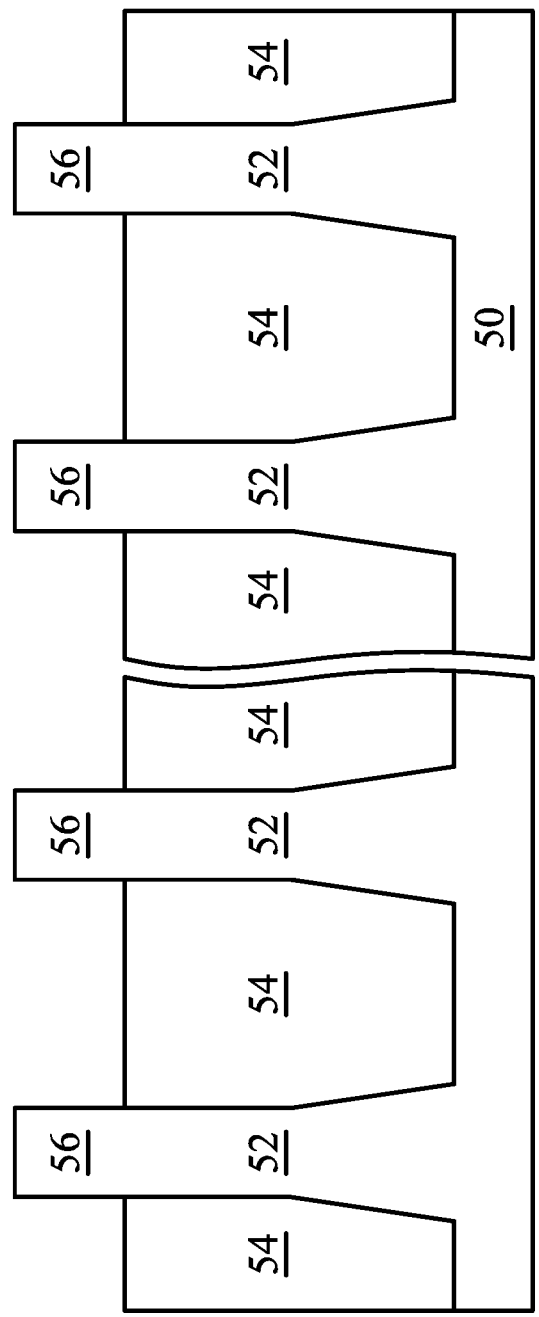

In FIG. 5, the isolation regions 54 are recessed to form STI regions 54. The isolation regions 54 are recessed such that fins 56 in the first region 50B and in the second region 50C protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 3 through 5 is just one example of how fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the semiconductor strips 52 in FIG. 4 can be recessed, and a material different from the semiconductor strips 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form fins 56. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 56 may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 5, appropriate wells may be formed in the fins 56, fins 52, and/or substrate 50. For example, a P well may be formed in the first region 50B, and an N well may be formed in the second region 50C.

The different implant steps for the different regions 50B and 50C may be achieved using a photoresist or other masks (not shown). For example, a photoresist is formed over the fins 56 and the isolation regions 54 in the first region 50B. The photoresist is patterned to expose the second region 50C of the substrate 50, such as a PMOS region. The photoresist can be formed by using a spin-on technique and can be patterned using acceptable photolithography techniques. Once the photoresist is patterned, an n-type impurity implant is performed in the second region 50C, and the photoresist may act as a mask to substantially prevent n-type impurities from being implanted into the first region 50B, such as an NMOS region. The n-type impurities may be phosphorus, arsenic, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist is removed, such as by an acceptable ashing process.

Following the implanting of the second region 50C, a photoresist is formed over the fins 56 and the isolation regions 54 in the second region 50C. The photoresist is patterned to expose the first region 50B of the substrate 50, such as the NMOS region. The photoresist can be formed by using a spin-on technique and can be patterned using acceptable photolithography techniques. Once the photoresist is patterned, a p-type impurity implant may be performed in the first region 50B, and the photoresist may act as a mask to substantially prevent p-type impurities from being implanted into the second region, such as the PMOS region. The p-type impurities may be boron, $BF_2$, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist may be removed, such as by an acceptable ashing process.

After the implants of the first region 50B and the second region 50C, an anneal may be performed to activate the p-type and n-type impurities that were implanted. The implantations may form a p-well in the first region 50B, e.g., the NMOS region, and an n-well in the second region 50C, e.g., the PMOS region. In some embodiments, the grown materials of epitaxial fins may be in situ doped during growth, which may obviate the implantations, although in situ and implantation doping may be used together.

Figure 6:
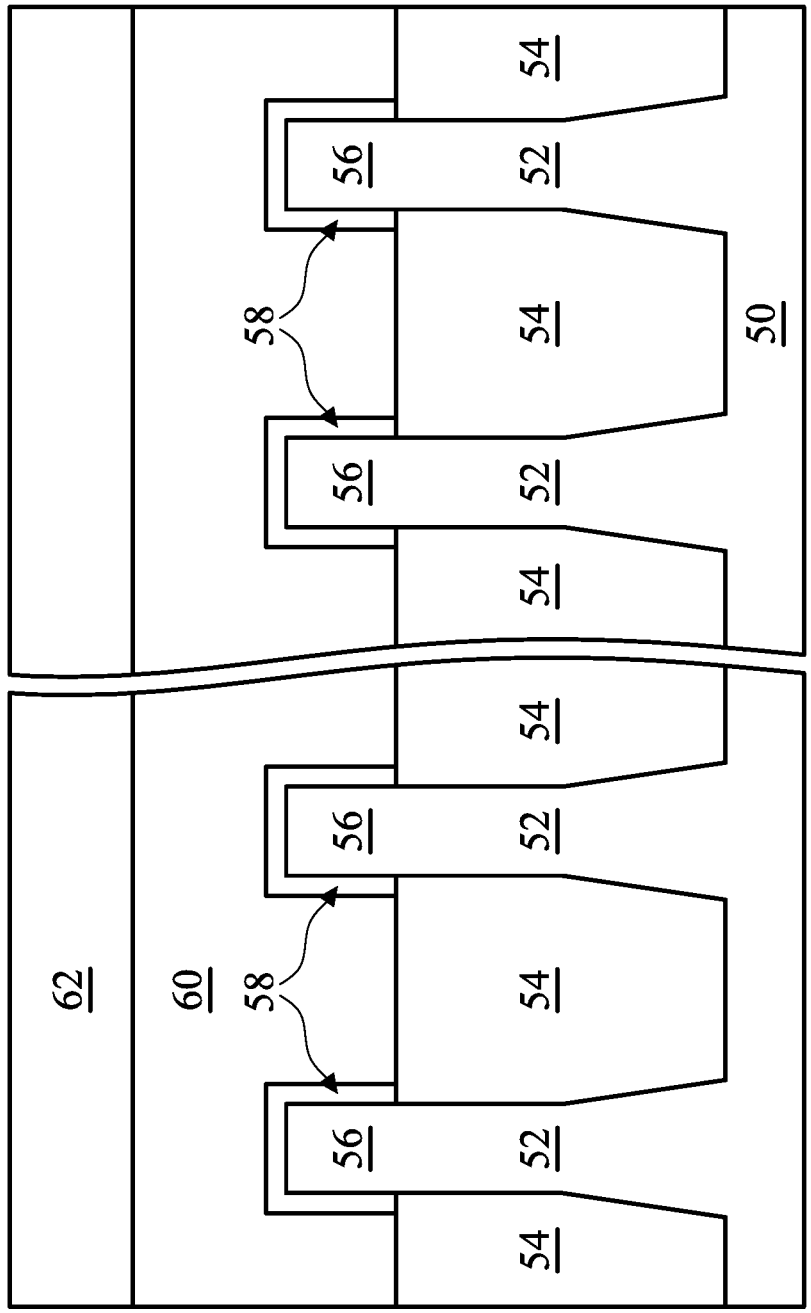

In FIG. 6, a dummy dielectric layer 58 is formed on the fins 56. The dummy dielectric layer 58 may be, for example, silicon oxide, silicon nitride, a combination thereof, or the like, and may be deposited or thermally grown according to acceptable techniques. A dummy gate layer 60 is formed over the dummy dielectric layer 58, and a mask layer 62 is formed over the dummy gate layer 60. The dummy gate layer 60 may be deposited over the dummy dielectric layer 58 and then planarized, such as by a CMP. The mask layer 62 may be deposited over the dummy gate layer 60. The dummy gate layer 60 may be made of, for example, polysilicon, although other materials that have a high etching selectivity from the etching of isolation regions 54 may also be used. The mask layer 62 may include, for example, silicon nitride or the like. In this example, a single dummy gate layer 60 and a single mask layer 62 are formed across the first region 50B and the second region 50C. In other embodiments, separate dummy gate layers may be formed in the first region 50B and the second region 50C, and separate mask layers may be formed in the first region 50B and the second region 50C.

Figure 7A:
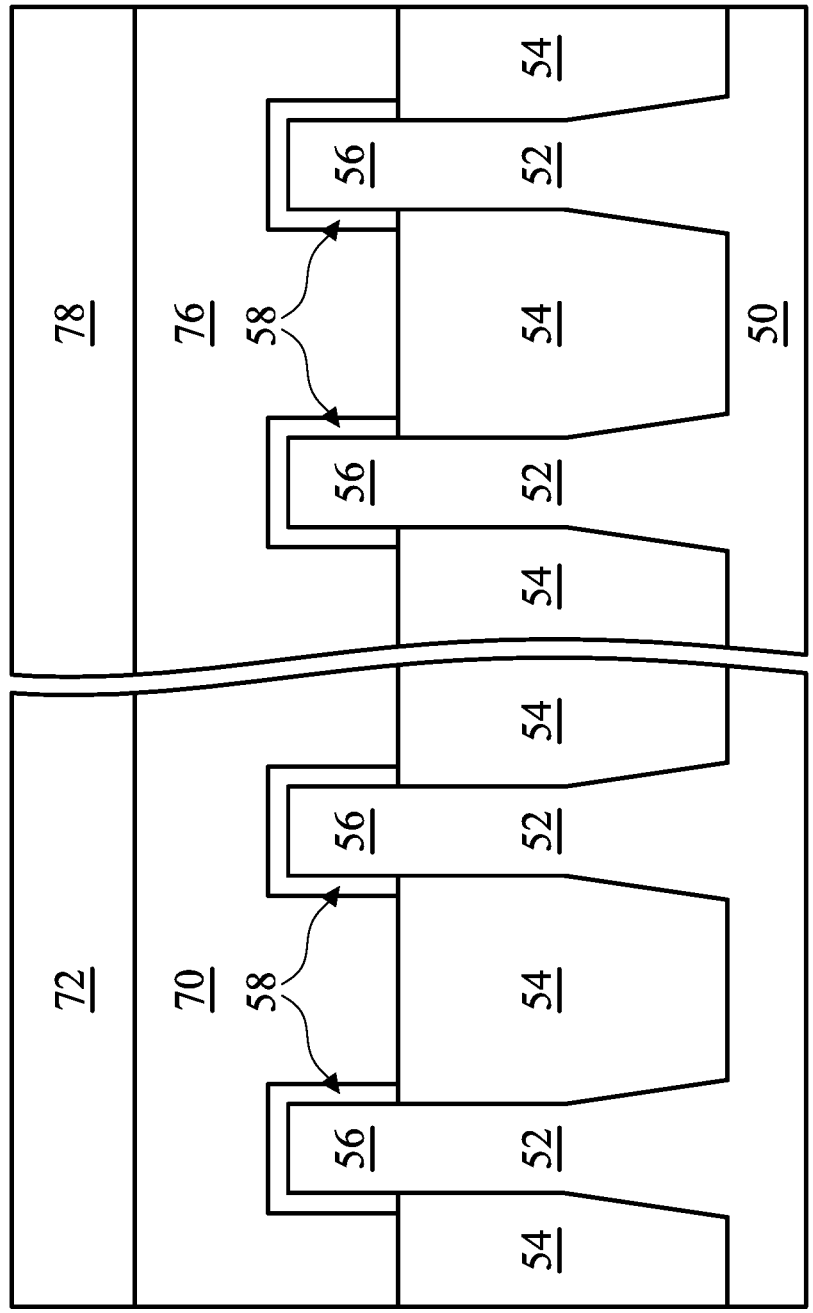
Figure 7C:
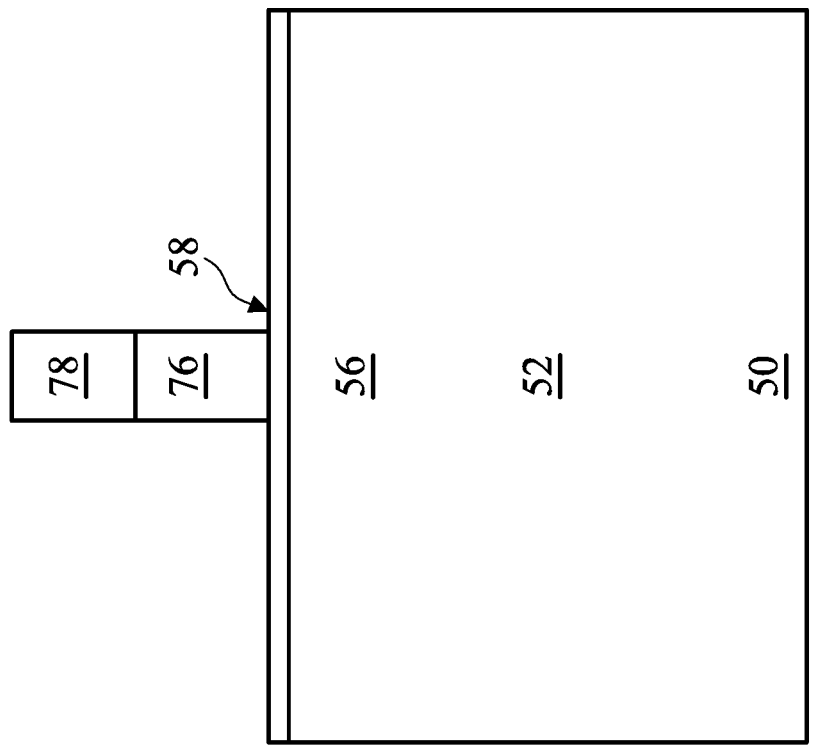
Figure 7B:
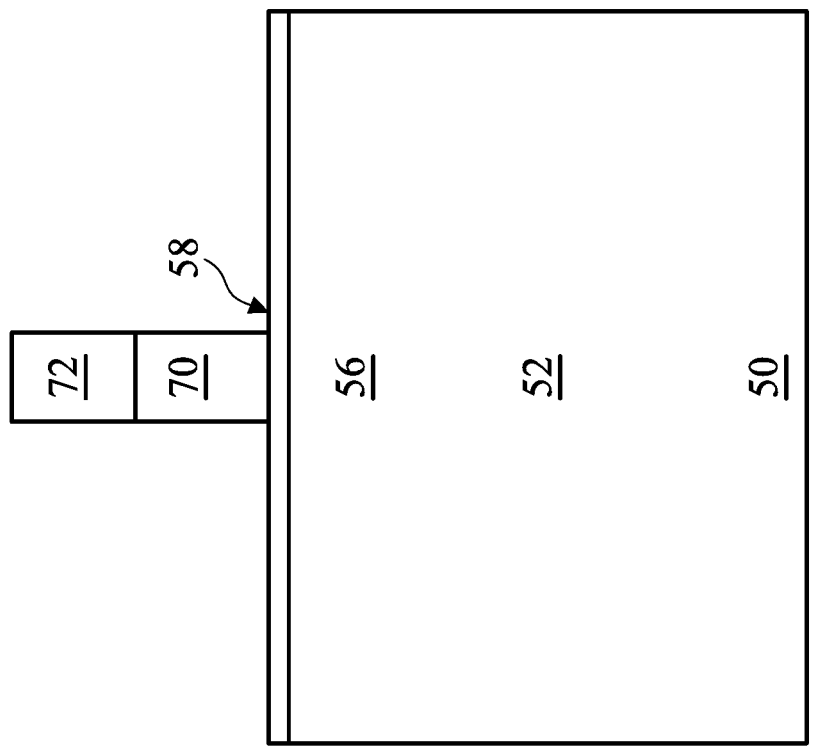

In FIGS. 7A, 7B, and 7C, the mask layer 62 may be patterned using acceptable photolithography and etching techniques to form masks 72 in the first region 50B (as illustrated in FIG. 7B) and masks 78 in the second region 50C (as illustrated in FIG. 7C). The pattern of the masks 72 and 78 then may be transferred to the dummy gate layer 60 and dummy dielectric layer 58 by an acceptable etching technique to form dummy gates 70 in the first region 50B and dummy gates 76 in the second region 50C. The dummy gates 70 and 76 cover respective channel regions of the fins 56. The dummy gates 70 and 76 may also have a lengthwise direction substantially perpendicular to the lengthwise direction of respective epitaxial fins.

Figure 8A:
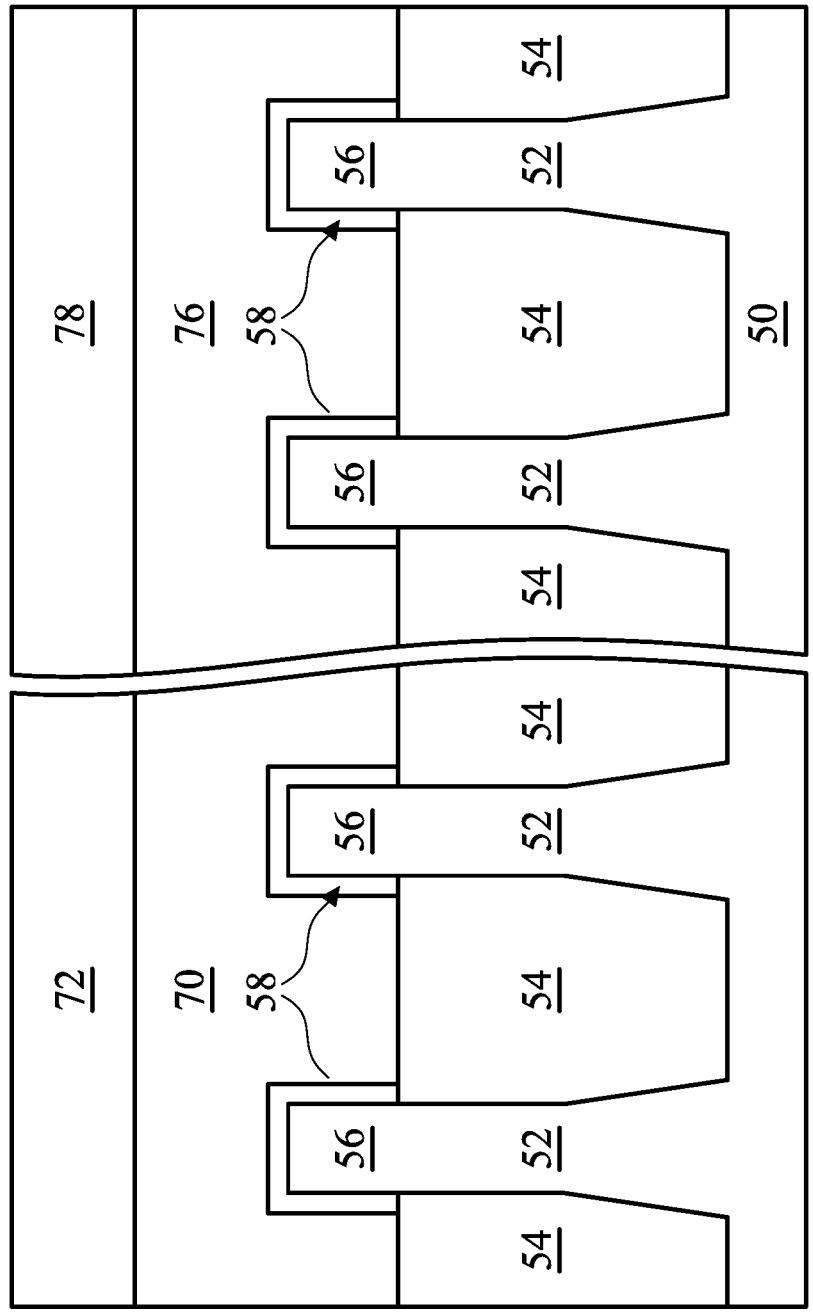
Figure 8C:
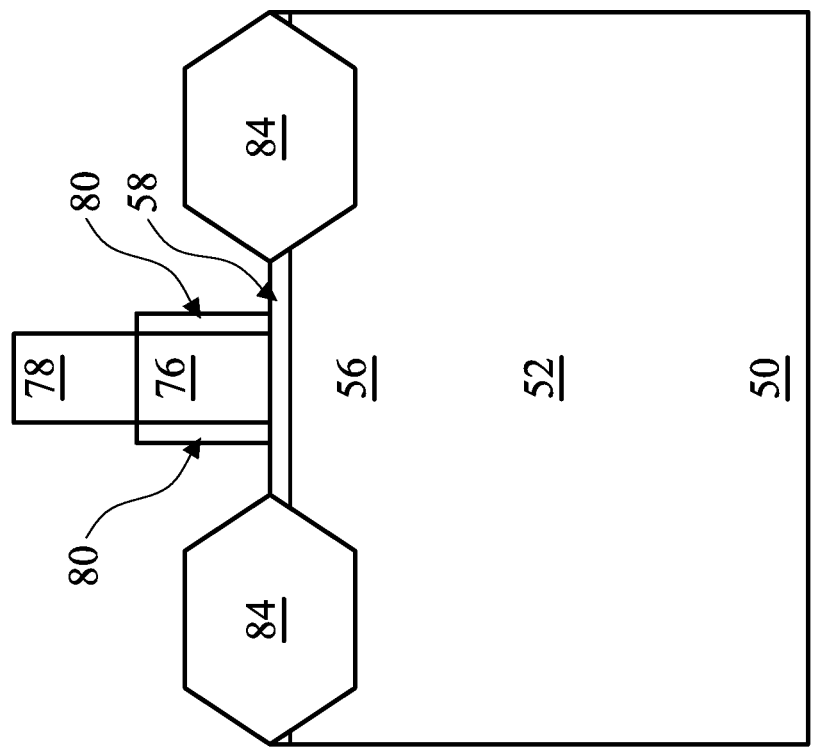
Figure 8B:
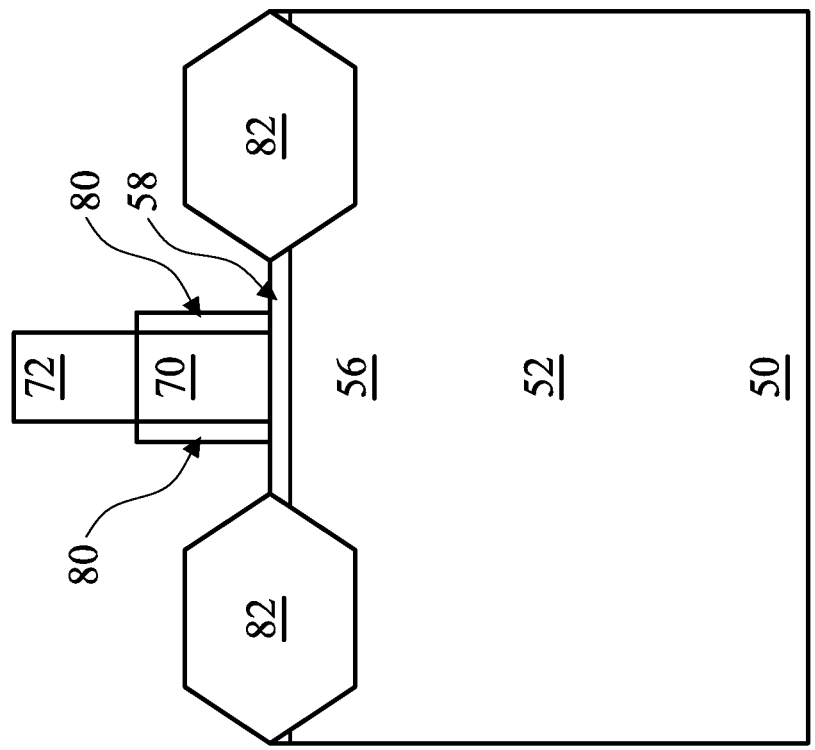

In FIGS. 8A, 8B, and 8C, gate seal spacers 80 can be formed on exposed surfaces of respective dummy gates 70 and 76 and/or fins 56. A thermal oxidation or a deposition followed by an anisotropic etch may form the gate seal spacers 80.

After the formation of the gate seal spacers 80, implants for lightly doped source/drain (LDD) regions may be performed. Similar to the implants discussed above in FIG. 5, a mask, such as a photoresist, may be formed over the first region 50B, e.g., NMOS region, while exposing the second region 50C, e.g., PMOS region, and p-type impurities may be implanted into the exposed fins 56 in the second region 50C. The mask may then be removed. Subsequently, a mask, such as a photoresist, may be formed over the second region 50C while exposing the first region 50B, and n-type impurities may be implanted into the exposed fins 56 in the first region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Further in FIGS. 8A, 8B, and 8C, epitaxial source/drain regions 82 and 84 are formed in the fins 56. In the first region 50B, epitaxial source/drain regions 82 are formed in the fins 56 such that each dummy gate 70 is disposed between respective neighboring pairs of the epitaxial source/drain regions 82. In some embodiments that epitaxial source/drain regions 82 may extend into the fins 52. In the second region 50C, epitaxial source/drain regions 84 are formed in the fins 56 such that each dummy gate 76 is disposed between respective neighboring pairs of the epitaxial source/drain regions 84. In some embodiments that epitaxial source/drain regions 84 may extend into the fins 52.

Epitaxial source/drain regions 82 in the first region 50B, e.g., the NMOS region, may be formed by masking the second region 50C, e.g., the PMOS region, and conformally depositing a dummy spacer layer in the first region 50B followed by an anisotropic etch to form dummy gate spacers (not shown) along sidewalls of the dummy gates 70 and/or gate seal spacers 80 in the first region 50B. Then, source/drain regions of the epitaxial fins in the first region 50B are etched to form recesses. The epitaxial source/drain regions 82 in the first region 50B are epitaxially grown in the recesses. The epitaxial source/drain regions 82 may include any acceptable material, such as appropriate for n-type FinFETs. For example, if the fin 56 is silicon, the epitaxial source/drain regions 82 may include silicon, SiC, SiCP, SiP, or the like. The epitaxial source/drain regions 82 may have surfaces raised from respective surfaces of the fins 56 and may have facets. Subsequently, the dummy gate spacers in the first region 50B are removed, for example, by an etch, as is the mask on the second region 50C.

Epitaxial source/drain regions 84 in the second region 50C, e.g., the PMOS region, may be formed by masking the first region 50B, e.g., the NMOS region, and conformally depositing a dummy spacer layer in the second region 50C followed by an anisotropic etch to form dummy gate spacers (not shown) along sidewalls of the dummy gates 76 and/or gate seal spacers 80 in the second region 50C. Then, source/drain regions of the epitaxial fins in the second region 50C are etched to form recesses. The epitaxial source/drain regions 84 in the second region 50C are epitaxially grown in the recesses. The epitaxial source/drain regions 84 may include any acceptable material, such as appropriate for p-type FinFETs. For example, if the fin 56 is silicon, the epitaxial source/drain regions 84 may comprise SiGe, SiGeB, Ge, GeSn, or the like. The epitaxial source/drain regions 84 may have surfaces raised from respective surfaces of the fins 56 and may have facets. Subsequently, the dummy gate spacers in the second region 50C are removed, for example, by an etch, as is the mask on the first region 50B.

Figure 9A:
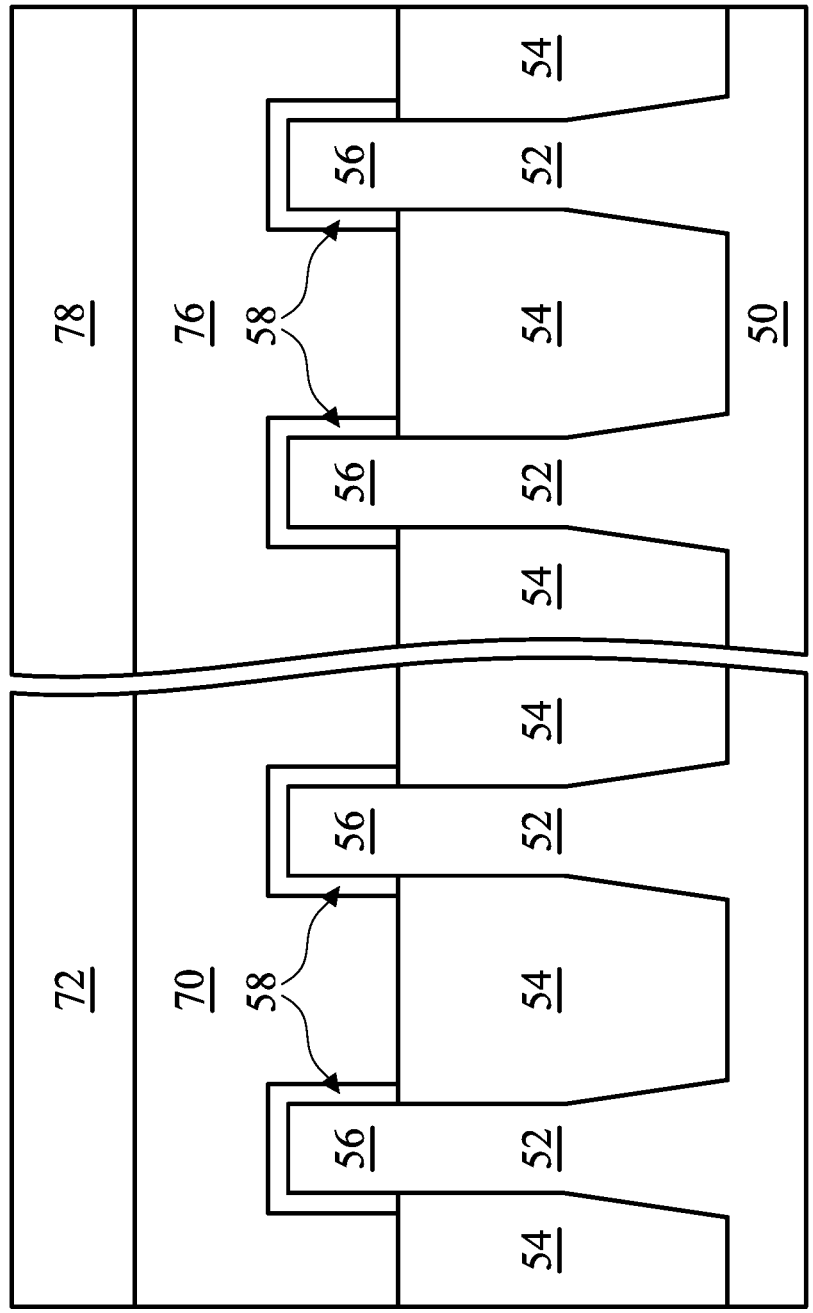
Figure 9C:
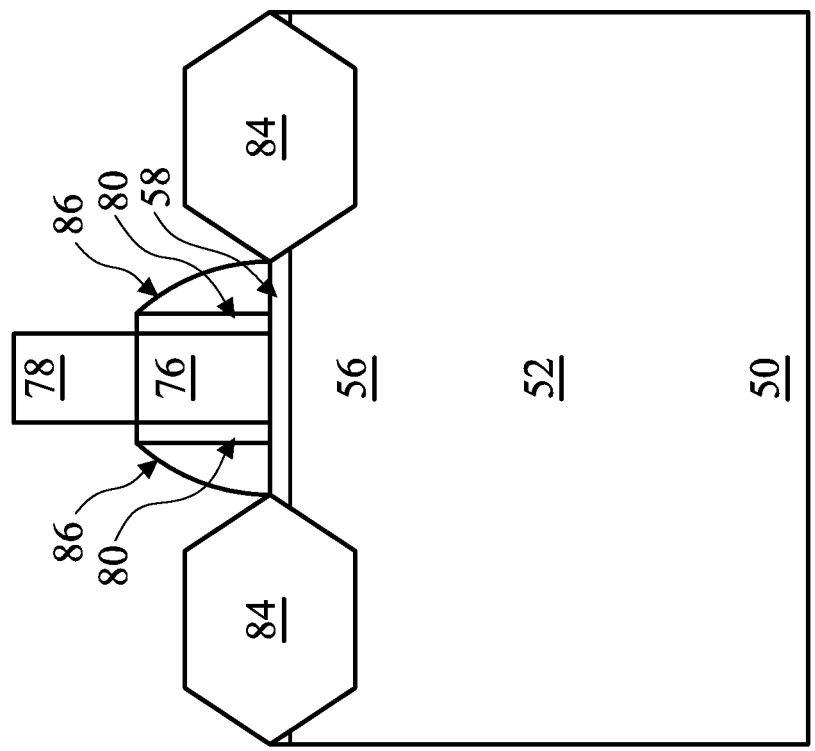
Figure 9B:
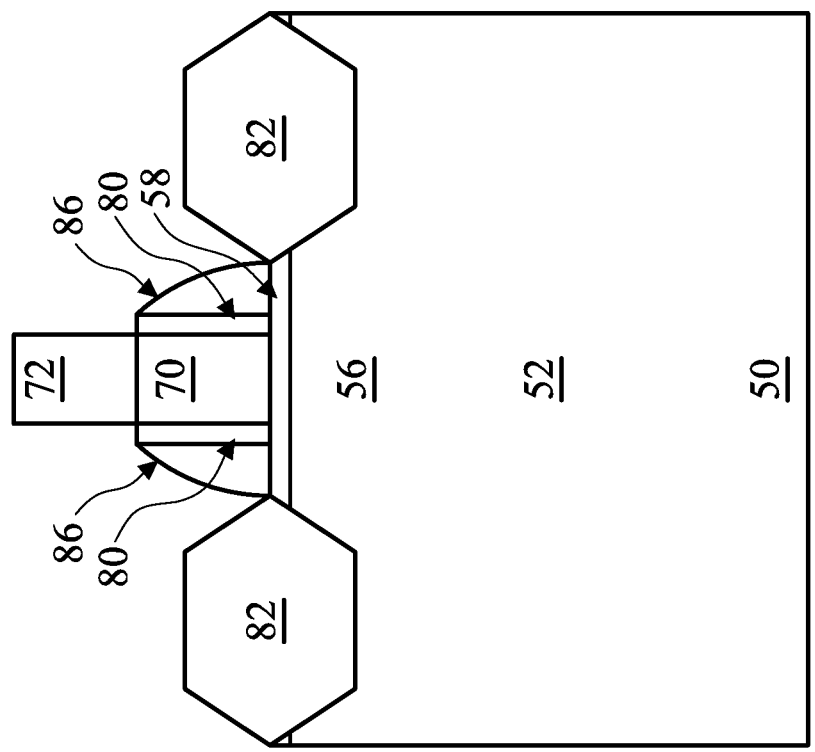

In FIGS. 9A, 9B, and 9C, gate spacers 86 are formed on the gate seal spacers 80 along sidewalls of the dummy gates 70 and 76. The gate spacers 86 may be formed by conformally depositing a material and subsequently anisotropically etching the material. The material of the gate spacers 86 may be silicon nitride, SiCN, a combination thereof, or the like.

The epitaxial source/drain regions 82 and 84 and/or epitaxial fins may be implanted with dopants to form source/drain regions, similar to the process previously discussed for forming lightly doped source/drain regions, followed by an anneal. The source/drain regions may have an impurity concentration of in a range from about $10^{19}$ cm$^{-3}$ to about $10^{21}$ cm$^{-3}$. The n-type impurities for source/drain regions in the first region 50B, e.g., the NMOS region, may be any of the n-type impurities previously discussed, and the p-type impurities for source/drain regions in the second region 50C, e.g., the PMOS region, may be any of the p-type impurities previously discussed. In other embodiments, the epitaxial source/drain regions 82 and 84 may be in situ doped during growth.

Figure 10A:
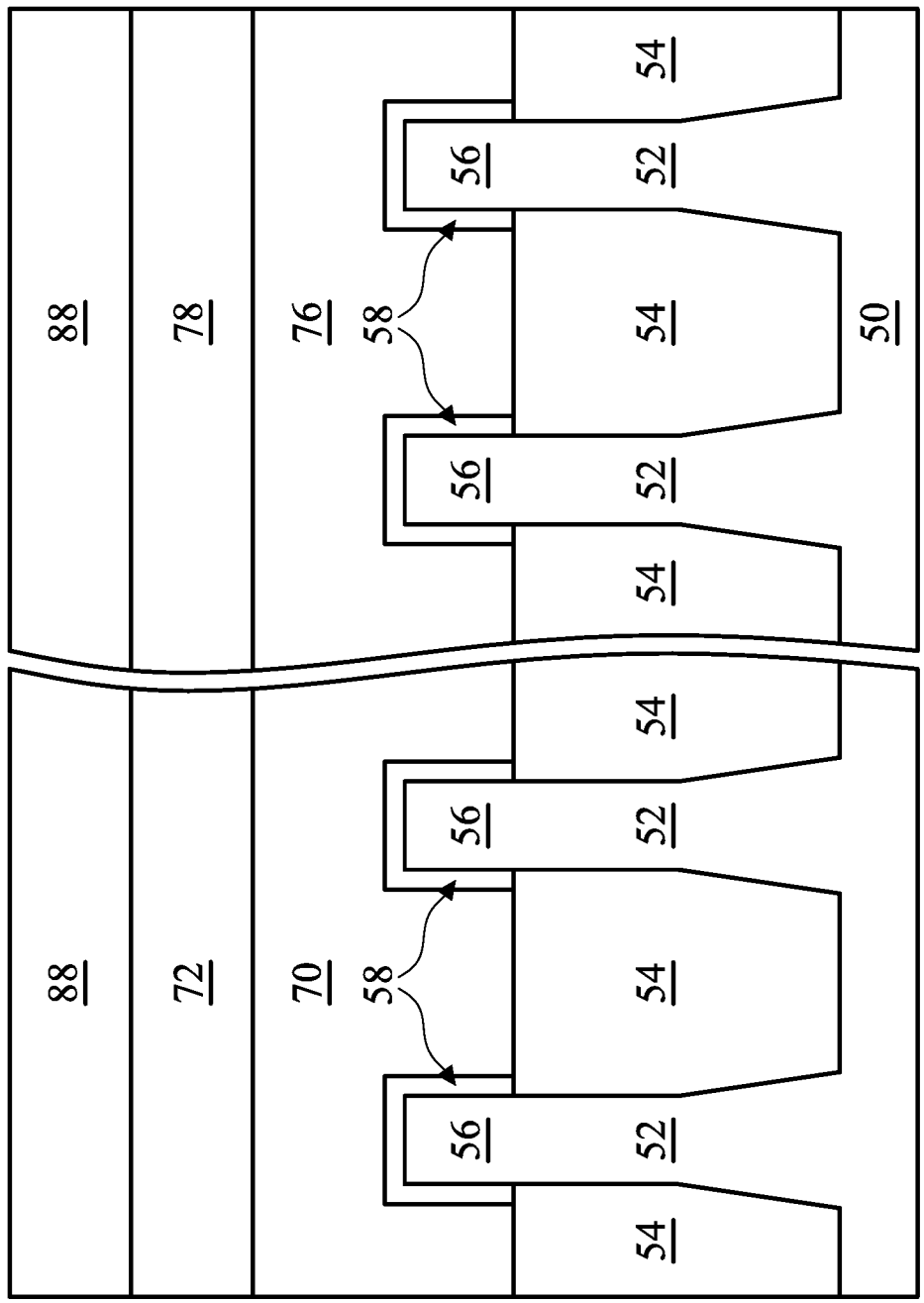
Figure 10C:
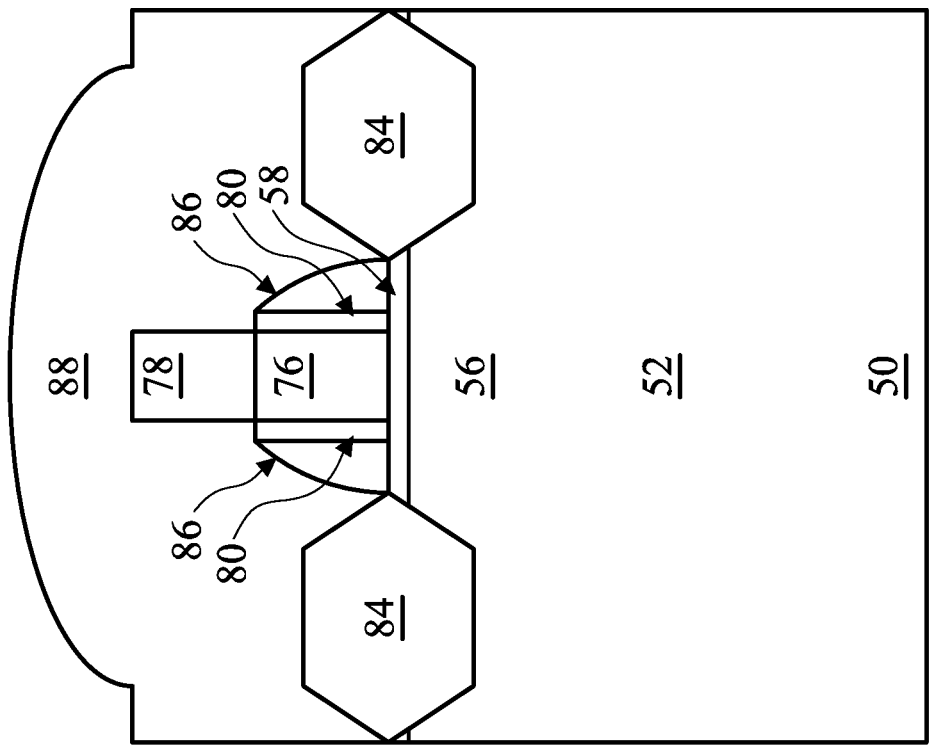
Figure 10B:
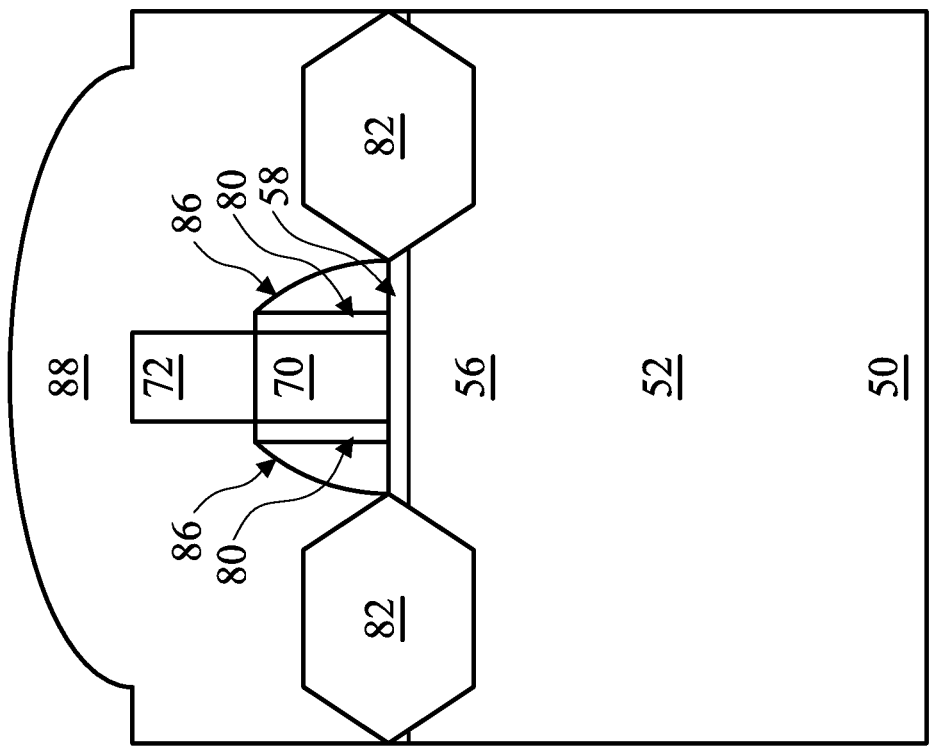

In FIGS. 10A, 10B, and 10C, an ILD 88 is deposited over the structure illustrated in FIGS. 9A, 9B, and 9C. In an embodiment, the ILD 88 is a flowable film formed by a flowable CVD. In some embodiments, the ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, or PECVD.

Figure 11A:
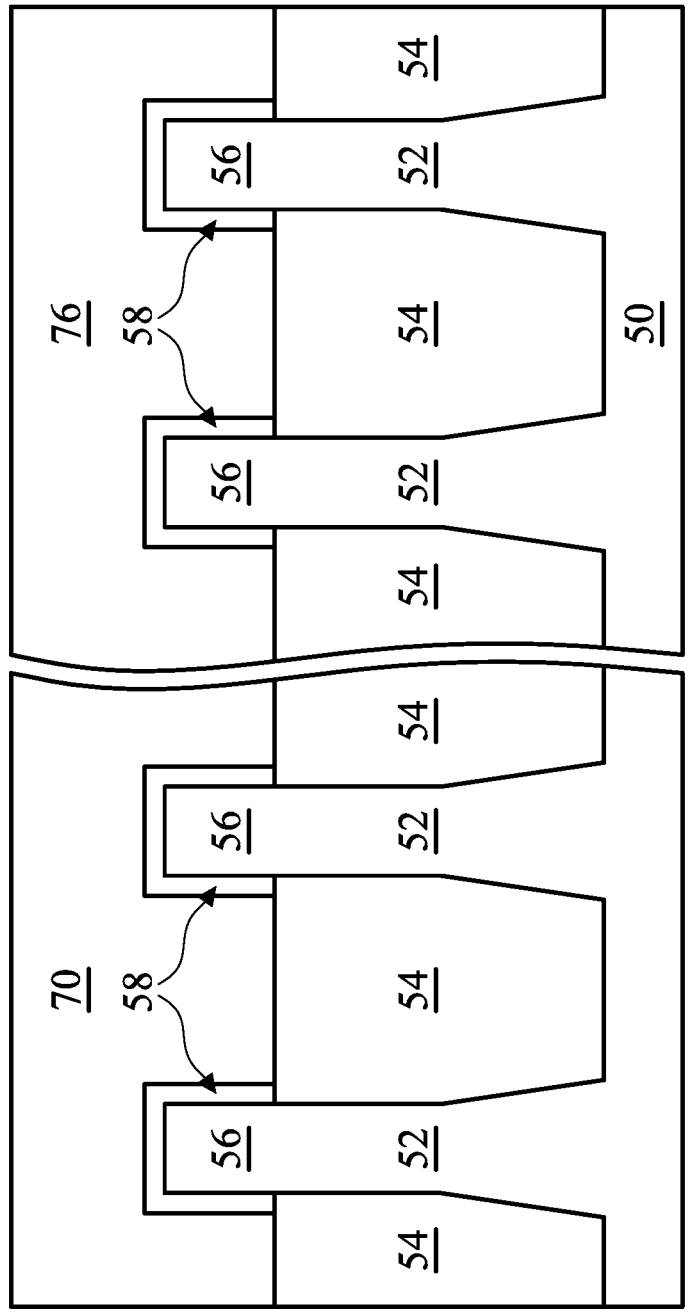
Figure 11C:
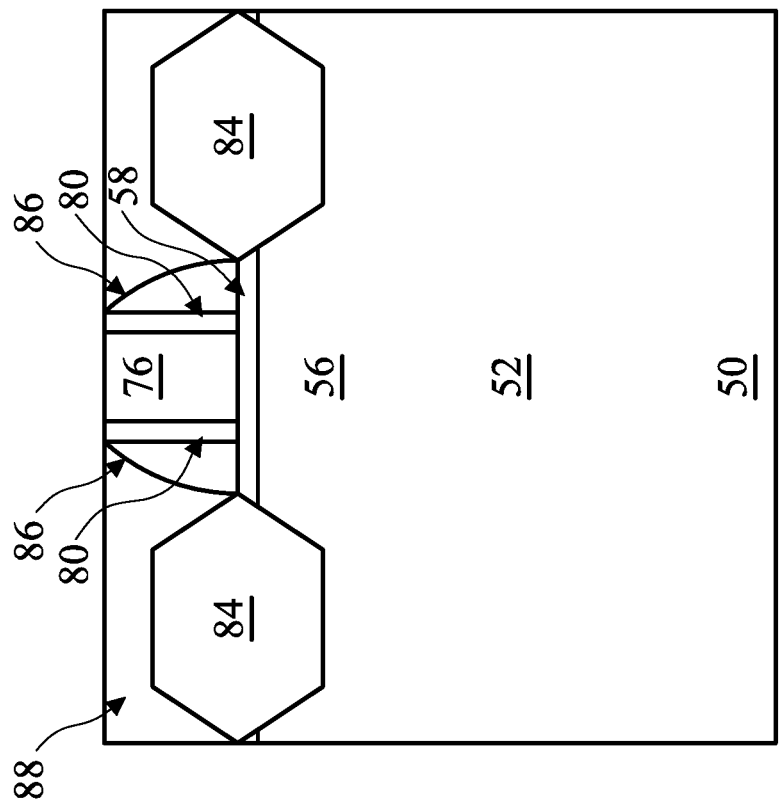
Figure 11B:
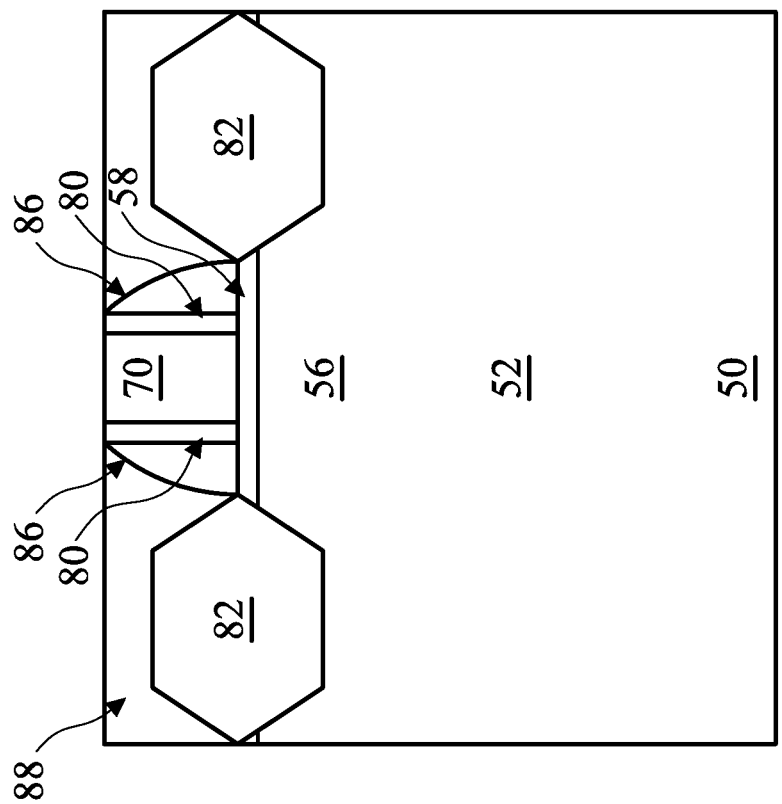

In FIGS. 11A, 11B, and 11C, a planarization process, such as a CMP, may be performed to level the top surface of ILD 88 with the top surfaces of the dummy gates 70 and 76. The CMP may also remove the masks 72 and 78 on the dummy gates 70 and 76. Accordingly, top surfaces of the dummy gates 70 and 76 are exposed through the ILD 88. In some embodiments, the ILD 88 may have a thickness of about 200 Å after the planarization process.

Figure 12A:
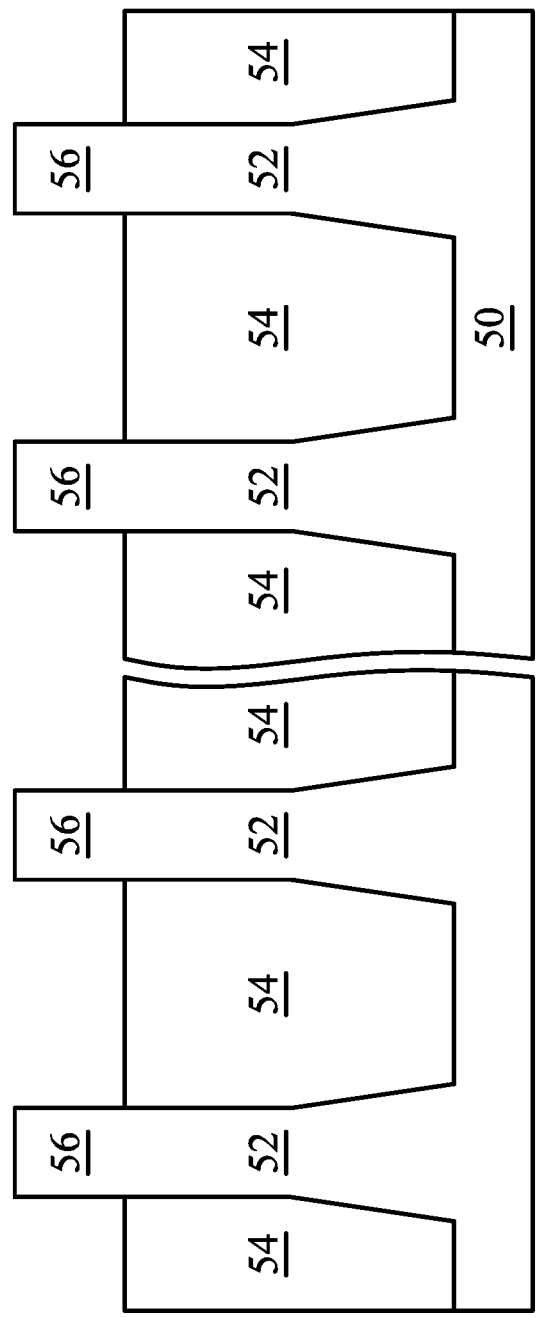
Figure 12C:
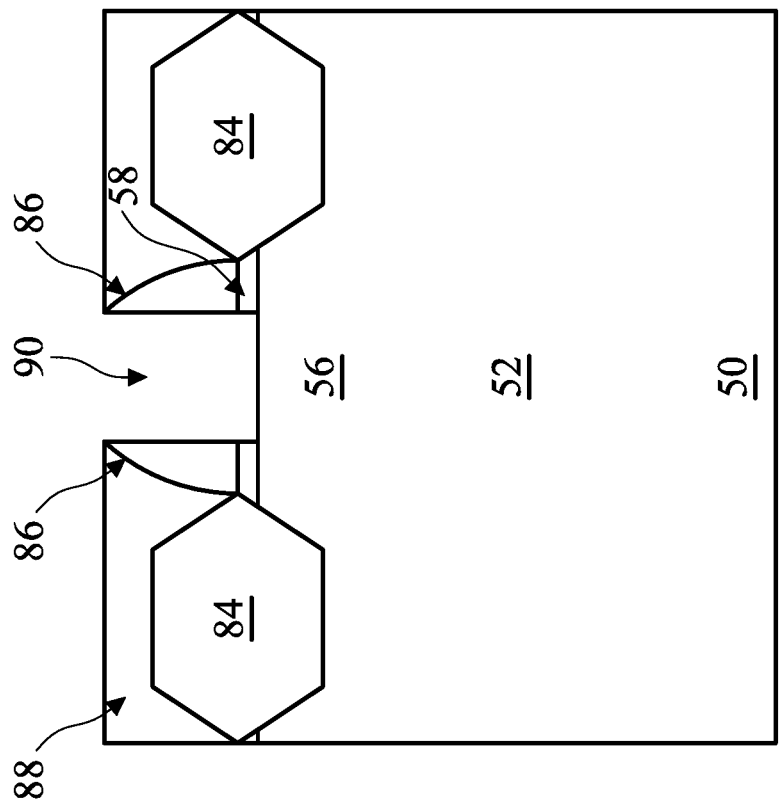
Figure 12B:
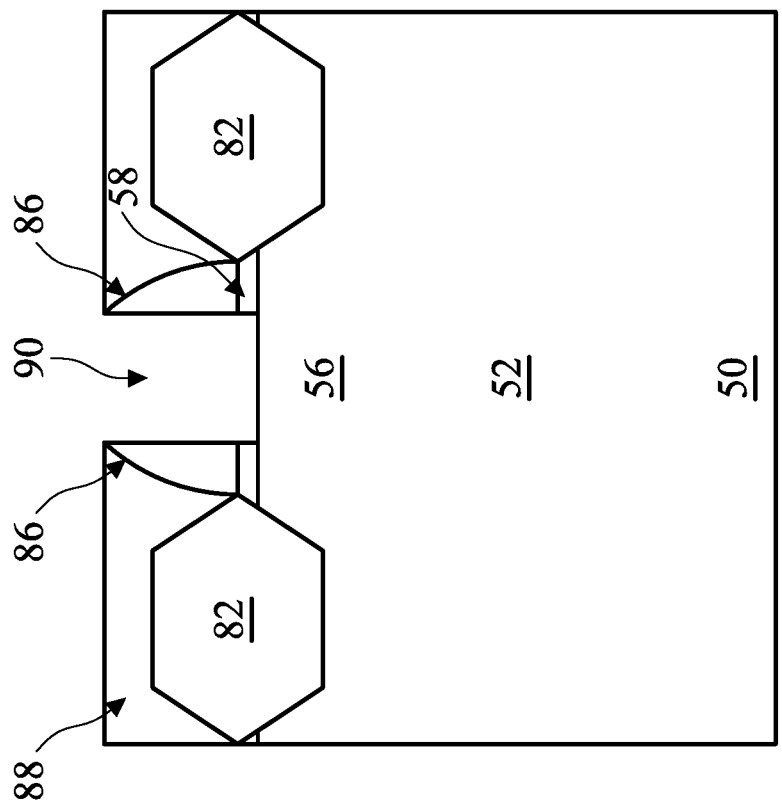

In FIGS. 12A, 12B, and 12C, the dummy gates 70 and 76, gate seal spacers 80, and portions of the dummy dielectric layer 58 directly underlying the dummy gates 70 and 76 are removed in an etching step(s), so that recesses 90 are formed. Each recess 90 exposes a channel region of a respective fin 56. Each channel region is disposed between neighboring pairs of epitaxial source/drain regions 82 and 84. During the removal, the dummy dielectric layer 58 may be used as an etch stop layer when the dummy gates 70 and 76 are etched. The dummy dielectric layer 58 and gate seal spacers 80 may then be removed after the removal of the dummy gates 70 and 76.

Figure 13A:
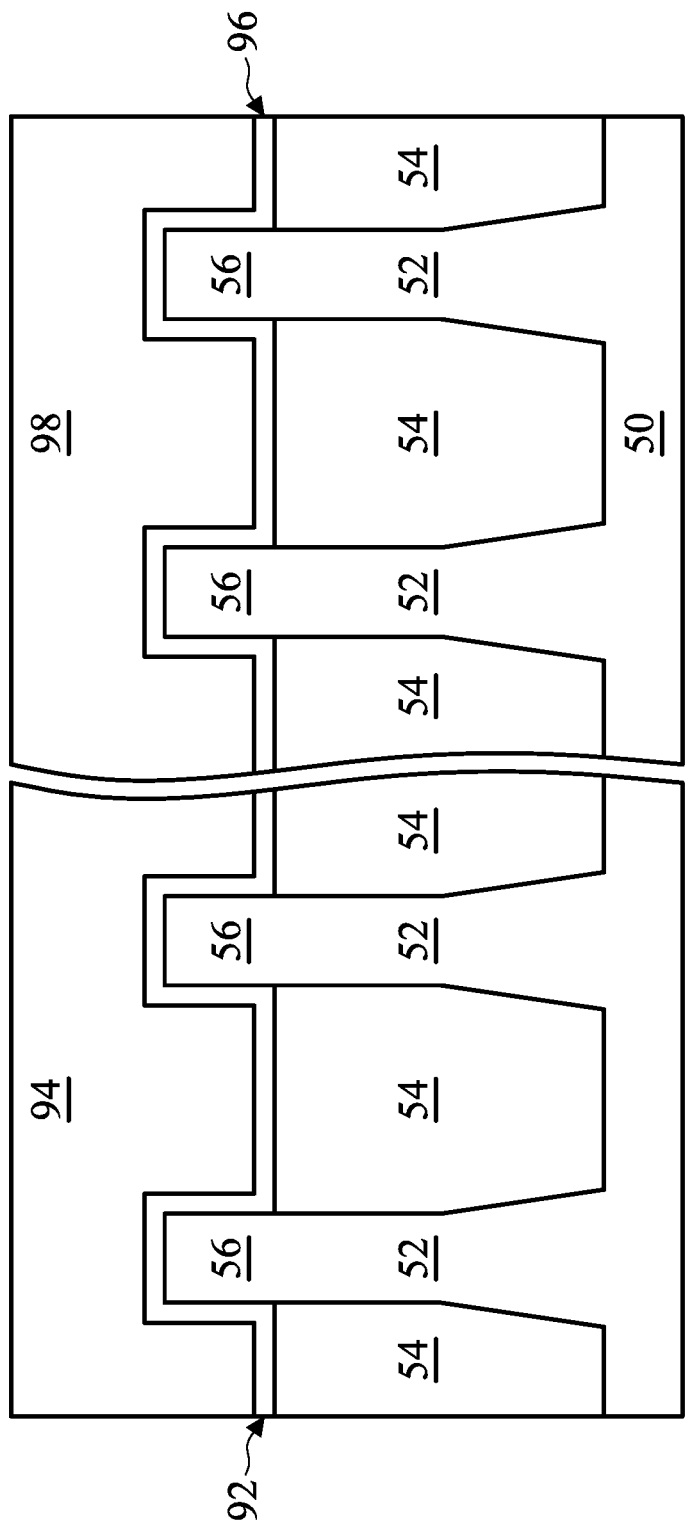
Figure 13C:
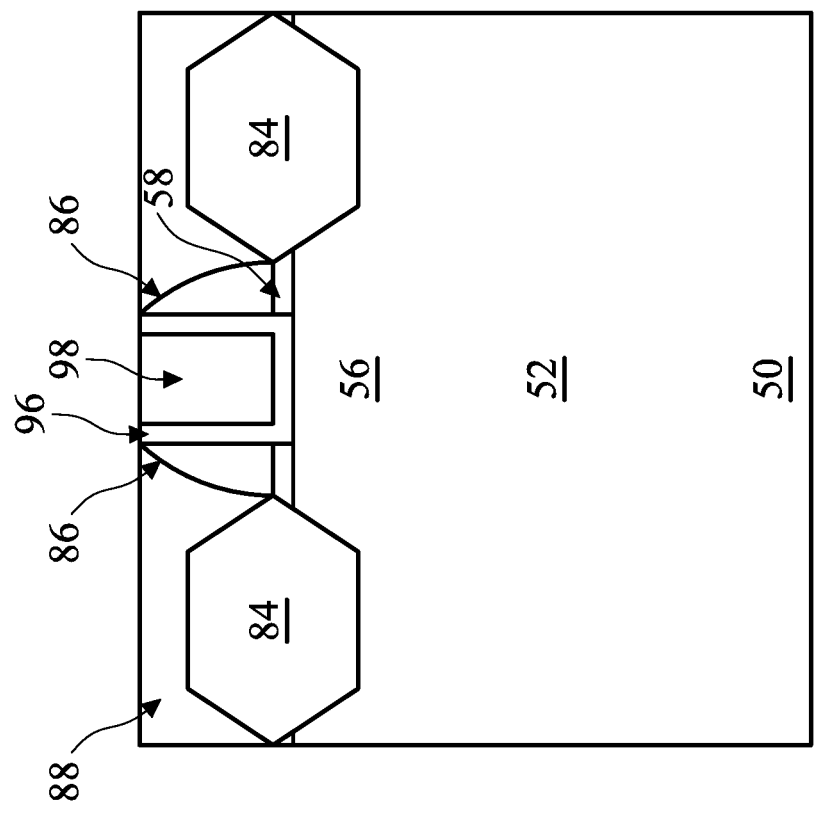
Figure 13B:
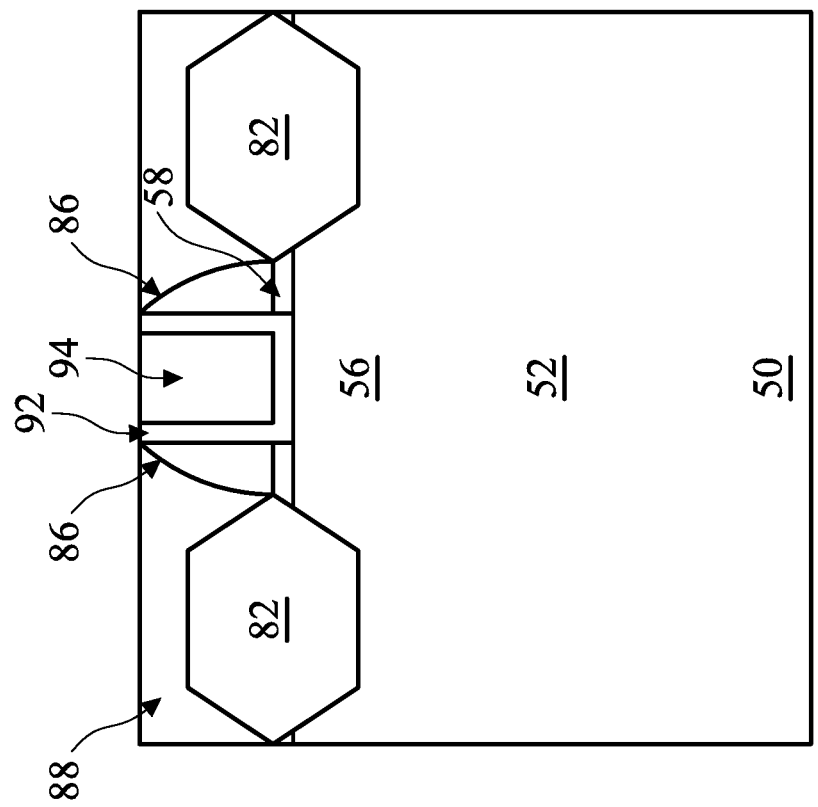

In FIGS. 13A, 13B, and 13C, gate dielectric layers 92 and 96 and gate electrodes 94 and 98 are formed for replacement gates. Gate dielectric layers 92 and 96 are deposited conformally in recesses 90, such as on the top surfaces and the sidewalls of the fins 56 and on sidewalls of the gate spacers 86, and on a top surface of the ILD 88. In accordance with some embodiments, gate dielectric layers 92 and 96 comprise silicon oxide, silicon nitride, or multilayers thereof. In other embodiments, gate dielectric layers 92 and 96 include a high-k dielectric material, and in these embodiments, gate dielectric layers 92 and 96 may have a k value greater than about 7.0, and may include a metal oxide or a silicate of Hf, Al, Zr, La, Mg, Ba, Ti, Pb, and combinations thereof. The formation methods of gate dielectric layers 92 and 96 may include Molecular-Beam Deposition (MBD), Atomic Layer Deposition (ALD), PECVD, and the like.

Next, gate electrodes 94 and 98 are deposited over gate dielectric layers 92 and 96, respectively, and fill the remaining portions of the recesses 90. Gate electrodes 94 and 98 may be made of a metal-containing material such as TiN, TaN, TaC, Co, Ru, Al, W, combinations thereof, or multilayers thereof. After the filling of gate electrodes 94 and 98, a planarization process, such as a CMP, may be performed to remove the excess portions of gate dielectric layers 92 and 96 and the material of gate electrodes 94 and 98, which excess portions are over the top surface of ILD 88. The resulting remaining portions of material of gate electrodes 94 and 98 and gate dielectric layers 92 and 96 thus form replacement gates of the resulting FinFETs, and may be collectively referred to as gate stacks.

The formation of the gate dielectric layers 92 and 96 may occur simultaneously such that the gate dielectric layers 92 and 96 are made of the same materials, and the formation of the gate electrodes 94 and 98 may occur simultaneously such that the gate electrodes 94 and 98 are made of the same materials. However, in other embodiments, the gate dielectric layers 92 and 96 may be formed by distinct processes, such that the gate dielectric layers 92 and 96 may be made of different materials, and the gate electrodes 94 and 98 may be formed by distinct processes, such that the gate electrodes 94 and 98 may be made of different materials. Various masking steps may be used to mask and expose appropriate regions when using distinct processes.

Figure 14A:
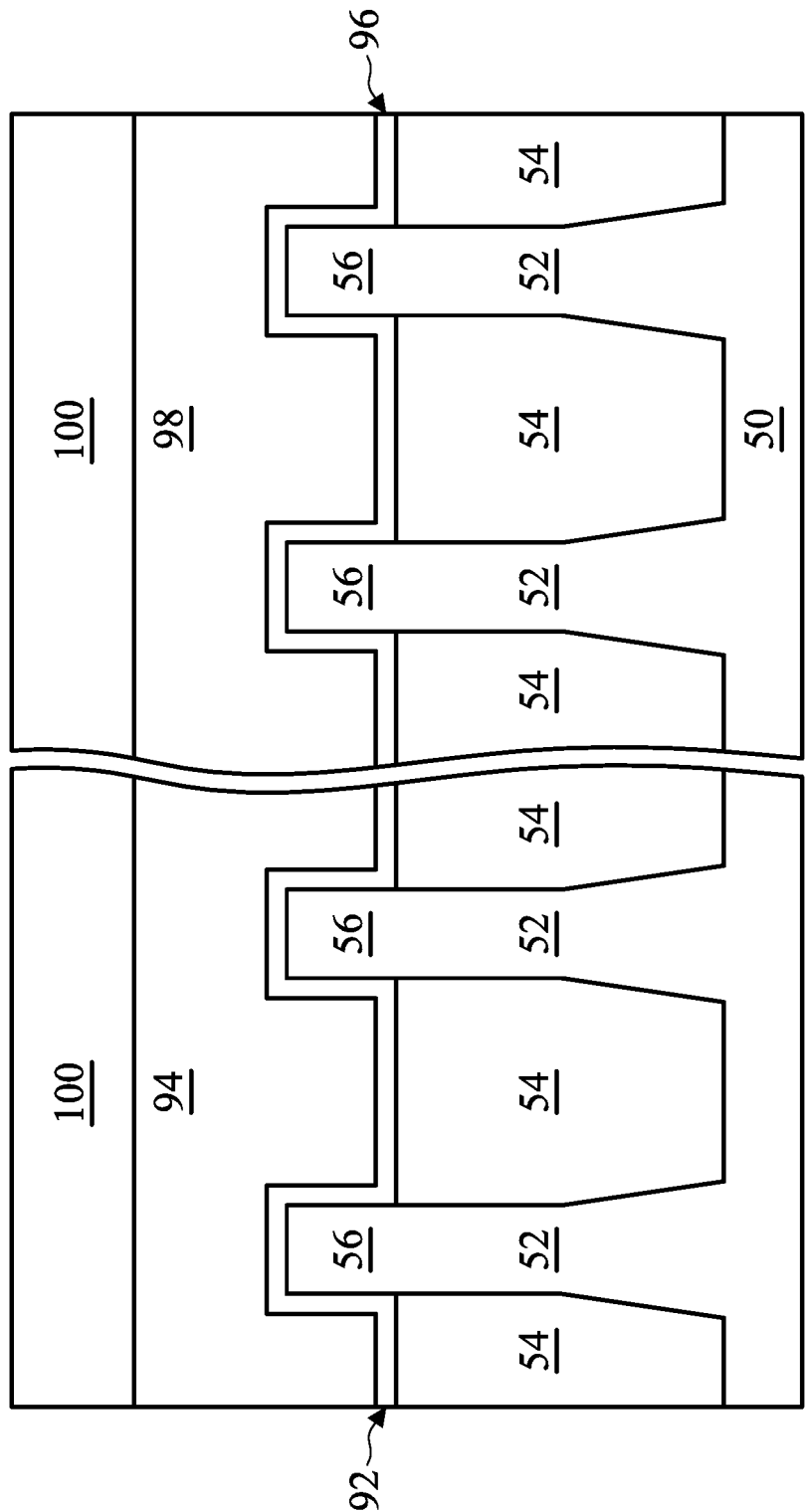
Figure 14C:
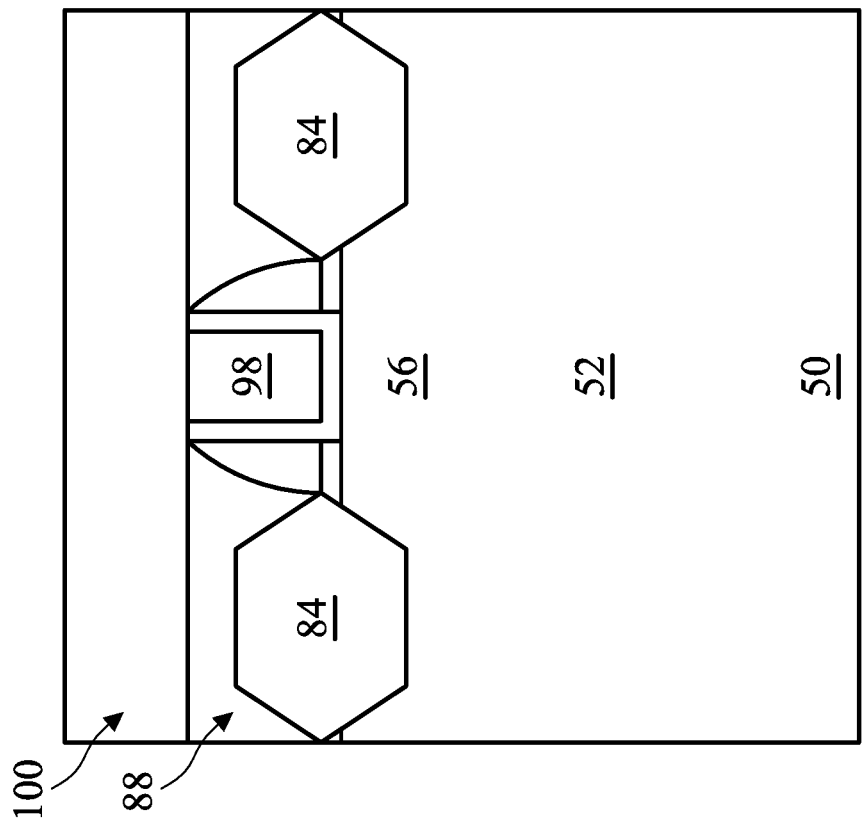
Figure 14B:
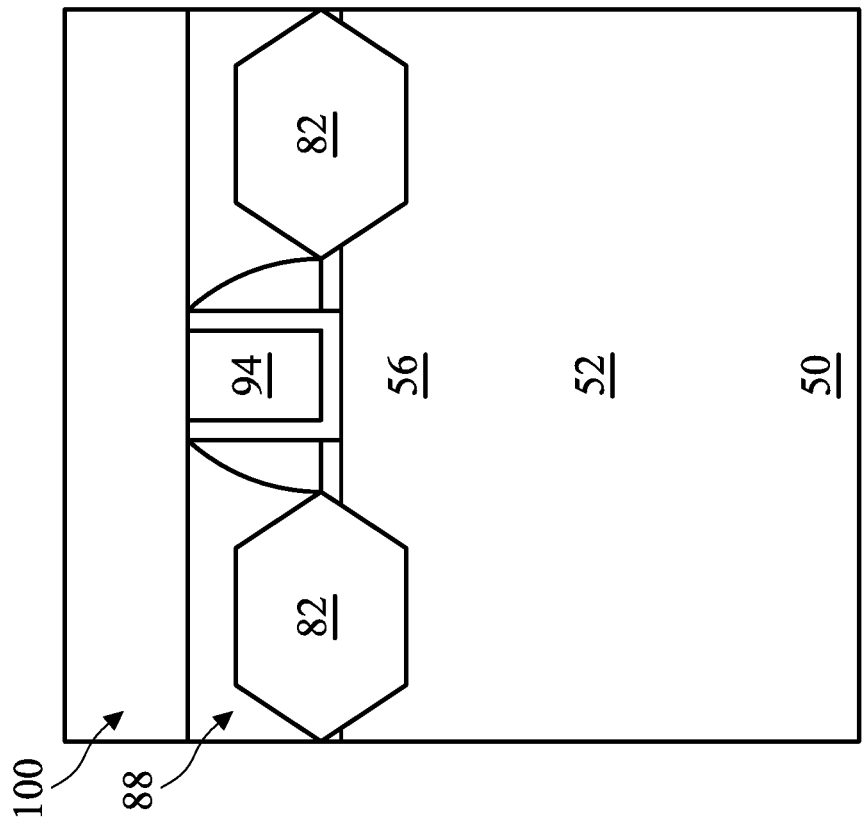

In FIGS. 14A, 14B, and 14C, an ILD 100 is deposited over the ILD 88. In an embodiment, the ILD 100 is a flowable film formed by a flowable CVD method. In some embodiments, the ILD 100 is formed of a dielectric material such as PSG, BSG, BPSG, USG, or the like, and may be deposited by any suitable method, such as CVD and PECVD. In some embodiments, the ILD 100 is a relatively porous dielectric. For example, the ILD 100 may be $SiO_2$, and may have a density of about 1.53 $g/cm^3$. The ILD 100 may be formed with a thickness of about 700 Å. The density of the ILD 100 may be lower than the density of the gate electrodes 94 and 98. For example, in embodiments where the gate electrodes 94 and 98 are TiN, they may have a density as high as 6.34 $g/cm^3$; likewise, in embodiments where the gate electrodes 94 and 98 are W, they may have a density as high as 19.6 $g/cm^3$.

In FIGS. 15A, 15B, 15C, 16A, 16B, and 16C, a compressive strain 102 is introduced on the gate stacks. The compressive strain 102 is in a lateral direction parallel to a longitudinal axis of the fins 56, and may reduce the width of the gate stacks, reducing increasing the dimension between the gate stacks and respective epitaxial source/drain regions 82. The compressive strain 102 may be introduced several ways.

Figure 15A:
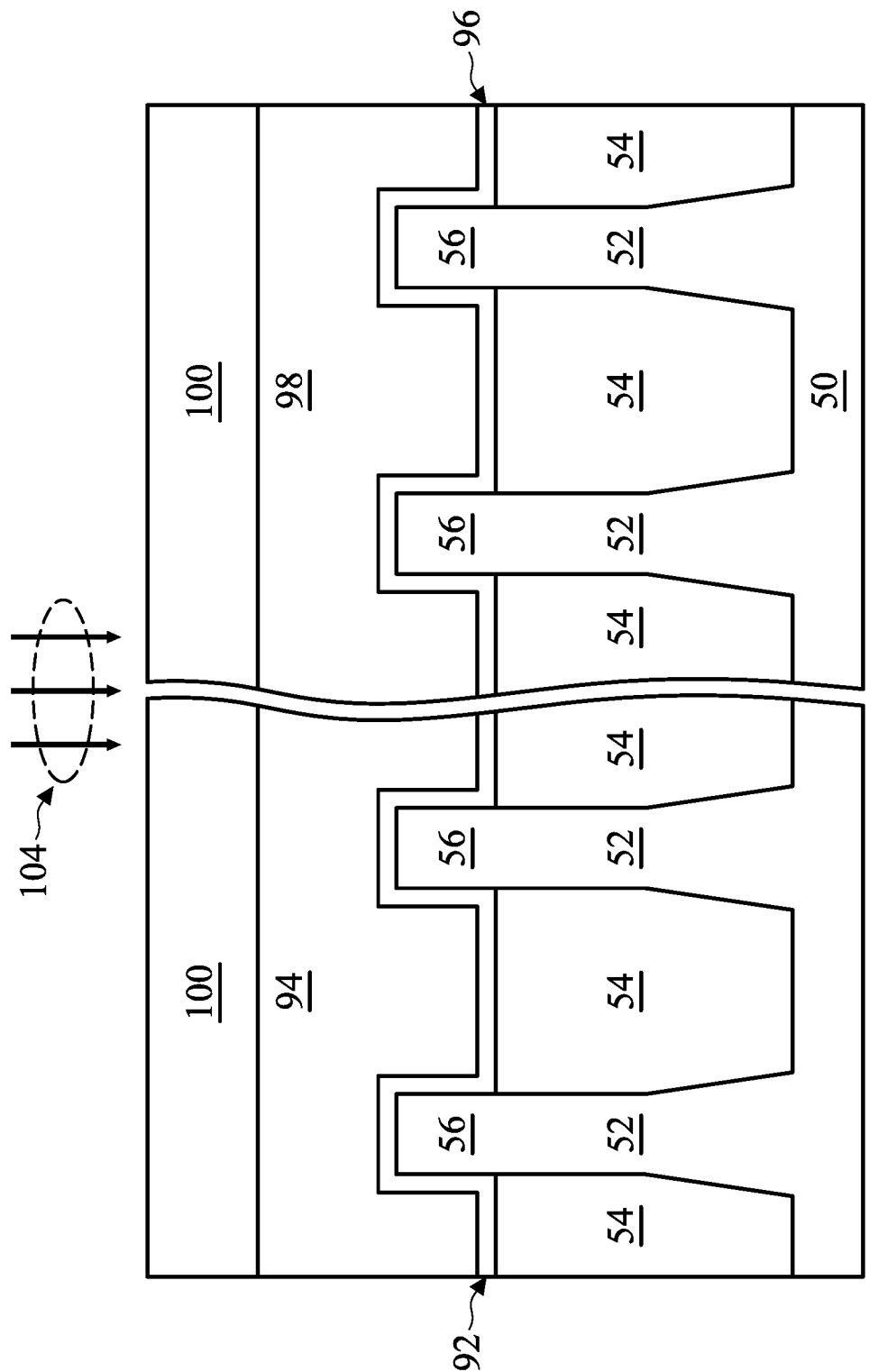
Figure 15C:
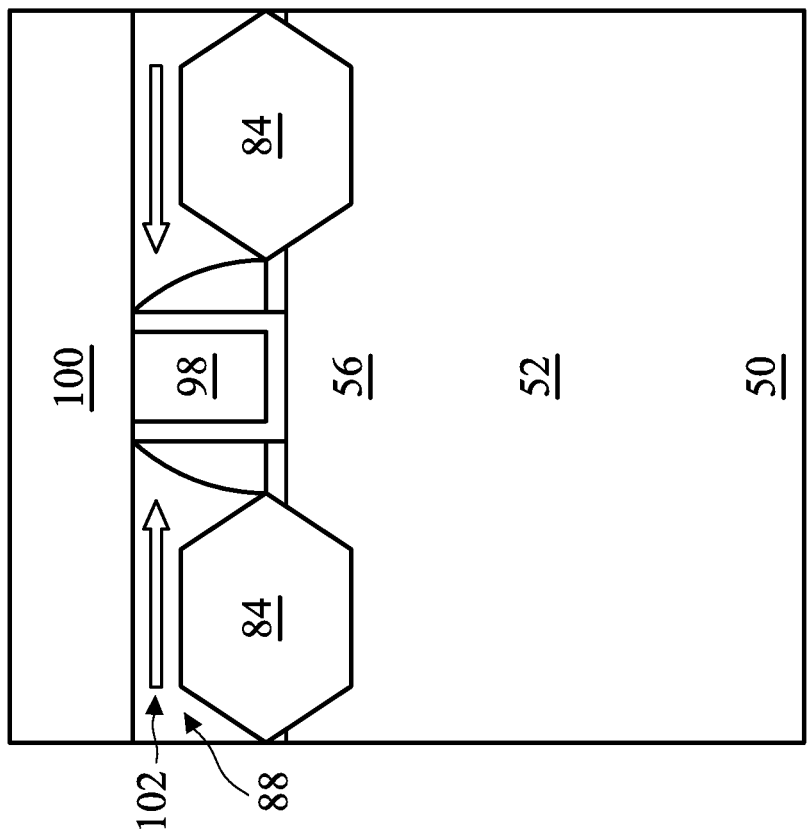
Figure 15B:
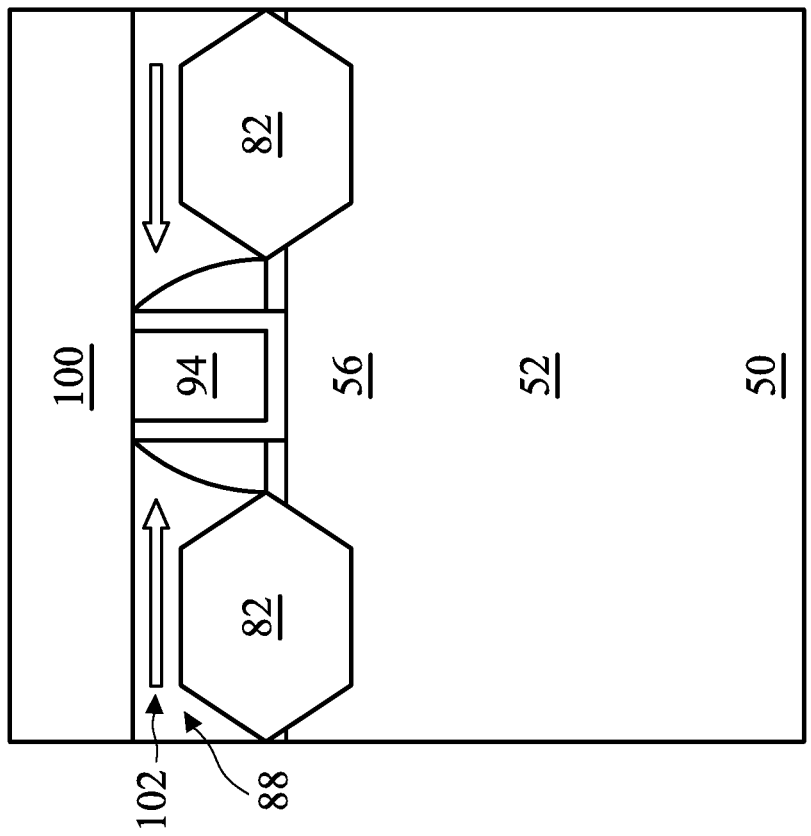

In the embodiment shown in FIGS. 15A, 15B, and 15C, the compressive strain 102 is introduced by implanting 104 the ILD 88 and the ILD 100 with a semiconductor impurity such as Si, Ge, As, Xe, or the like. The ILD 88 and the ILD 100 may be implanted to have an impurity concentration of in a range from about $10^{14}$ $cm^{-3}$ to about $10^{16}$ $cm^{-3}$. The implanting 104 may be performed at a high energy, such as between about 30 keV and about 40 keV, so that some of the impurities pass through the porous ILD 100 and implant in both the ILD 88 and the ILD 100. Implanting 104 the ILD 88 with a semiconductor impurity may increase the volume of the ILD 88, causing it to expand and thereby exert the compressive strain 102 on the gate electrodes 94 and 98 and the gate dielectric layers 92 and 96. After the implanting 104, the lattice constant of silicon in a portion of the gate stacks is less than 5.431 Å, due to the compressive strain 102. The ILD 88 may thus have a lower density than the ILD 100 after the implanting 104.

Figure 16A:
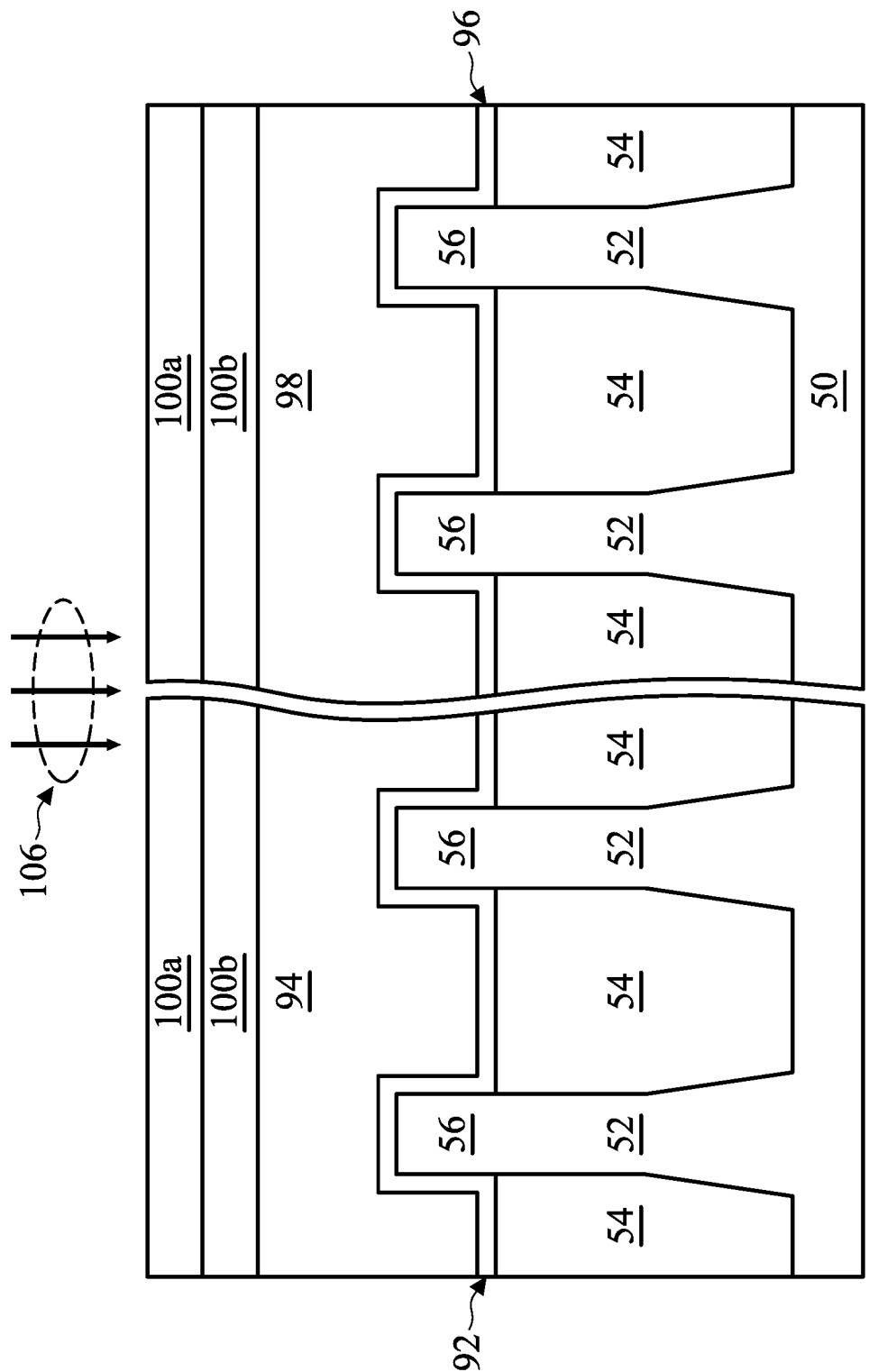
Figure 16C:
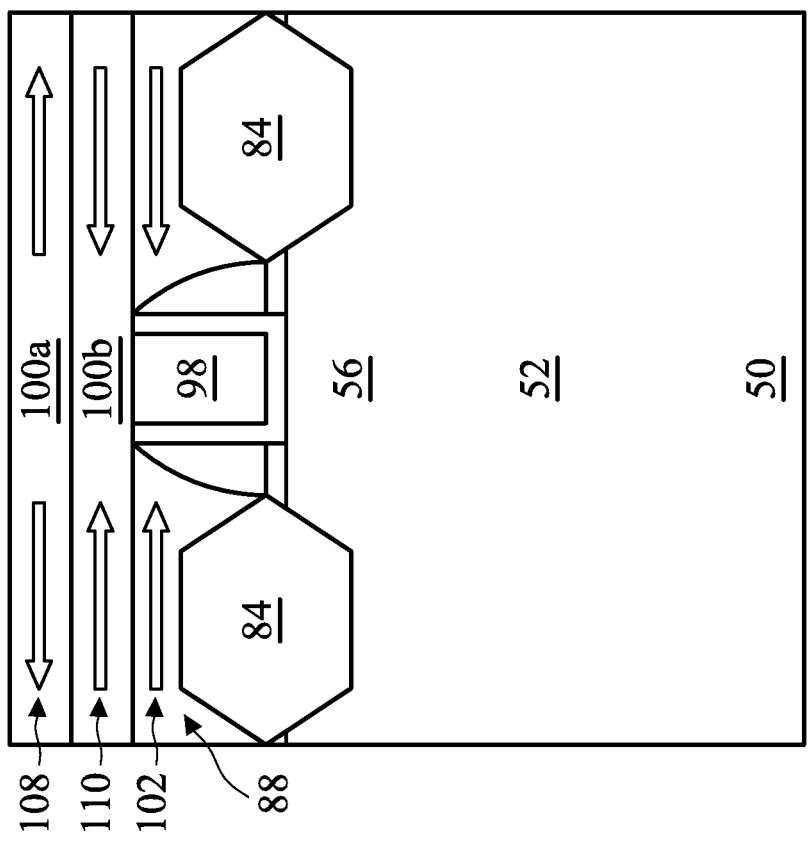
Figure 16B:
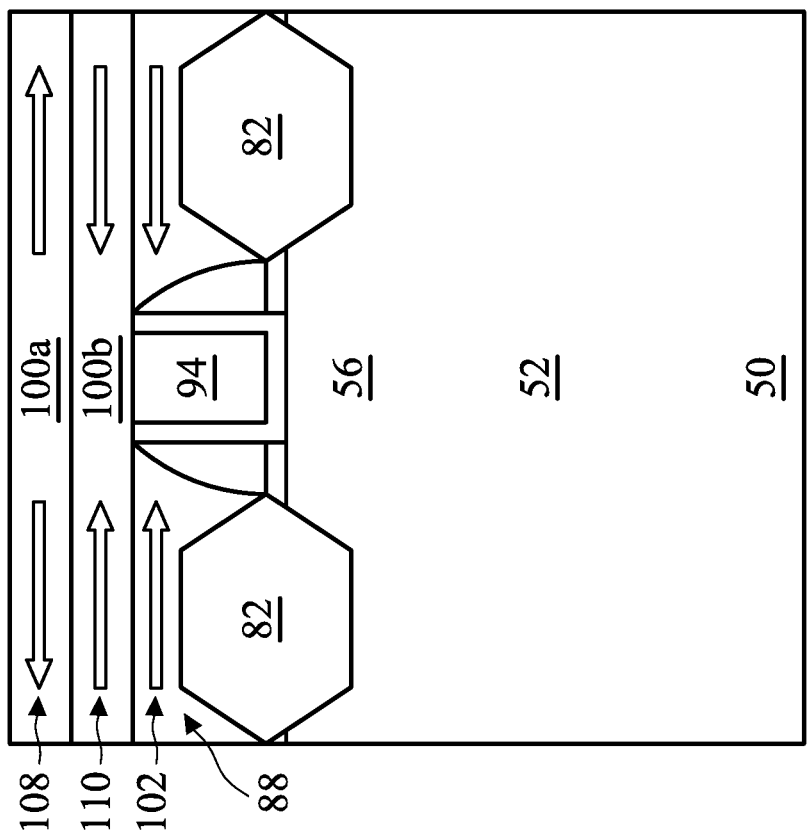

In the embodiment shown in FIGS. 16A, 16B, and 16C, the compressive strain 102 is introduced by implanting 106 the ILD 100 with a semiconductor impurity such as Si, Ge, As, Xe, or the like. The ILD 100 may be implanted to have an impurity concentration of in a range from about $10^{14}$ $cm^{-3}$ to about $10^{16}$ $cm^{-3}$. The implanting 106 may be performed at a low energy, such as between about 15 keV and about 25 keV, so that the impurities are implanted in a top portion 100a of the ILD 100. The impurities may implant in the top portion 100a to a depth of about 500 Å. Implanting 106 the top portion 100a with a semiconductor impurity may increase the volume of the top portion 100a, causing it to expand and thereby undergo a tensile strain 108. The tensile strain 108 produces a counterforce 110 in a bottom portion 100b of the ILD 100, which causes a similar strain in the ILD 88, thereby exerting the compressive strain 102 on the gate stacks. The top portion 100a may thus have a lower density than the ILD 88 and the bottom portion 100b after the implanting 106.

The implanting 104 and 106 shown in FIGS. 15A, 15B, 15C, 16A, 16B, and 16C may be performed under implantation conditions and with tools used in other implantation steps, such as the implants of the first region 50B and the second region 50C shown in FIG. 5. Further, although the implanting 104 and 106 are discussed above as being a high energy implant or a low energy implant, it should be appreciated that other implantation energies could be used. The level of strain on the gate stack may be precisely controlled through the use of different implantation energies, as called for by different products or applications.

Figure 17A:
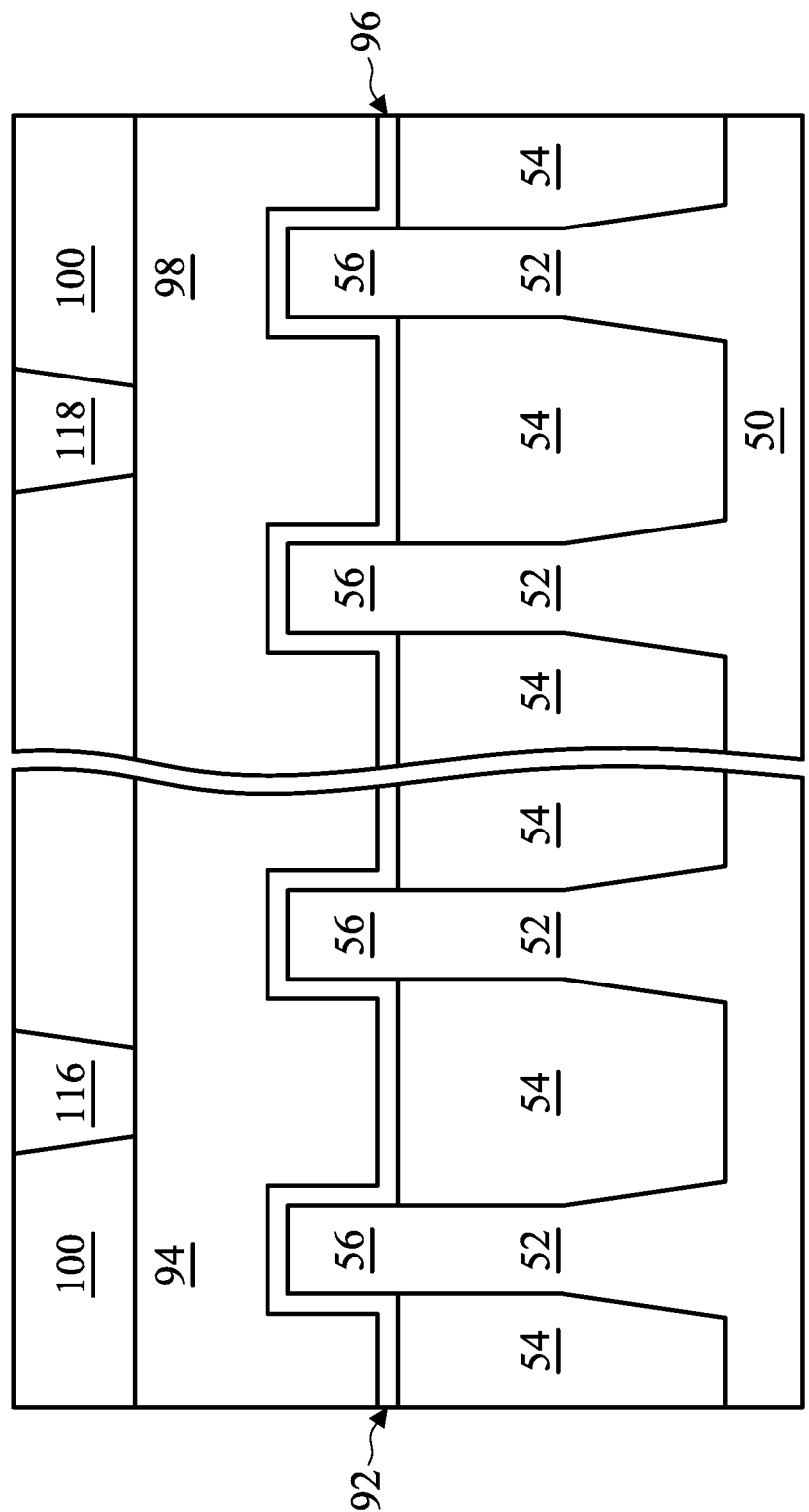
Figure 17C:
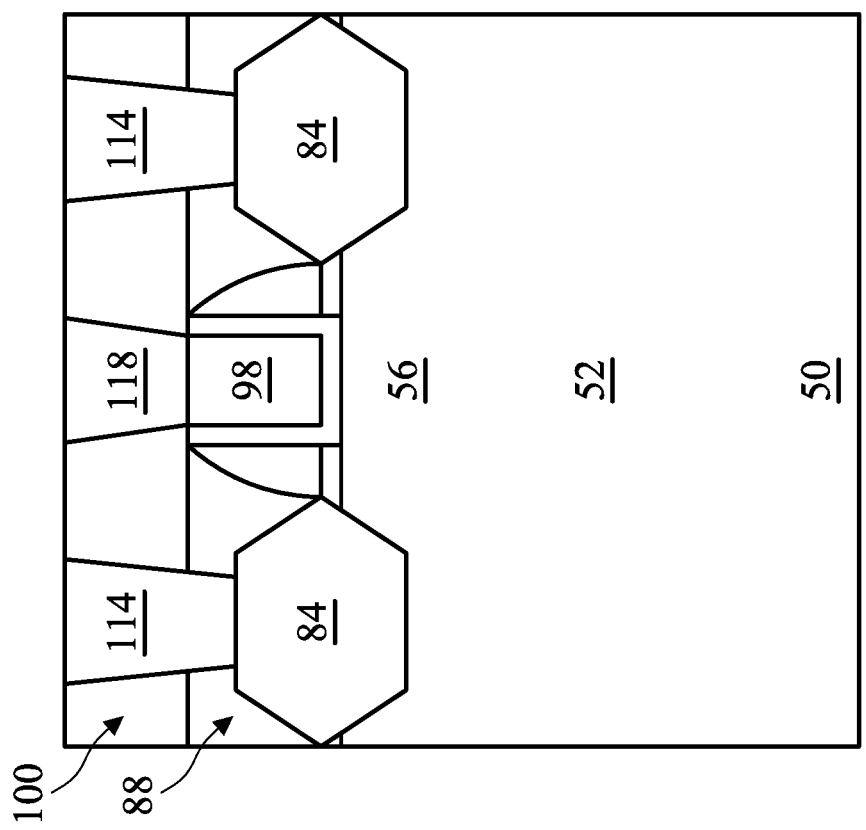
Figure 17B:
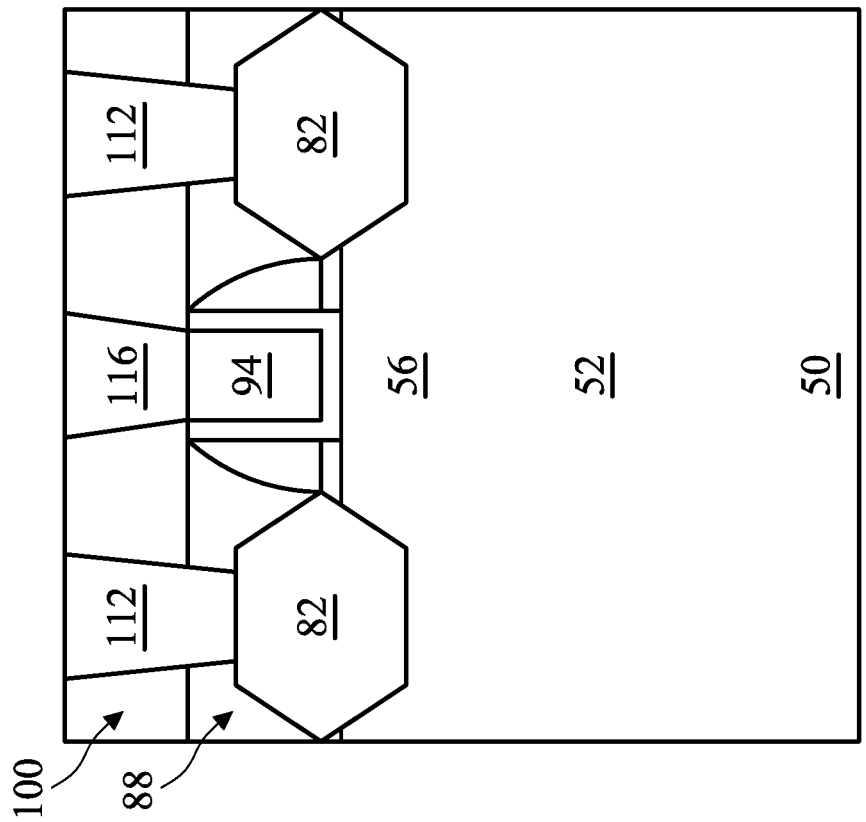

In FIGS. 17A, 17B, and 17C, contacts 112 and 114 are formed through ILD 100 and ILD 88 and contacts 116 and 118 are formed through ILD 100. Openings for the contacts 112 and 114 are formed through the ILDs 88 and 100. Openings for the contacts 116 and 118 are formed through the ILD 100. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 100. The remaining liner and conductive material form the contacts 112 and 114 in the openings. An anneal process may be performed to form a silicide at the interface between the epitaxial source/drain regions 82 and 84 and the contacts 112 and 114, respectively. The contacts 112 are physically and electrically coupled to the epitaxial source/drain regions 82, the contacts 114 are physically and electrically coupled to the epitaxial source/drain regions 84, the contact 116 is physically and electrically coupled to the gate electrode 94, and the contact 118 is physically and electrically coupled to the gate electrode 98.

In some embodiments, wires (not shown) may optionally be formed simultaneously with the contacts 112 and 114. The wires may couple the contacts 112 and 114 to other devices. In such embodiments, a hardmask is formed over the ILD 100, a dielectric layer is formed over the hardmask, and a silicon layer is formed over the dielectric layer. The silicon layer may be patterned, e.g., with a tri-layer lithography. A first etching process may be performed to form opening in the dielectric layer, the hardmask, and a first portion of the ILD 100. A second etching process may be performed using the patterned silicon layer as a mask to simultaneously extend the openings through the ILD 100 to expose the epitaxial source/drain regions 82, and form trenches in portions of the dielectric layer exposed by the patterned silicon layer. The conductive material may be formed in both the openings and the trenches, simultaneously forming the contacts 112 and 114 and the wires.

Embodiments may achieve advantages. Introducing a compressive strain on the gate stack may decrease the variations in gate stack width across the device from greater than about 14% to less than about 10%, such as about 7%. Gate stacks of more consistent width in the device may improve the reliability of lithography processes used to form metal contacts for FinFETs in the device. Straining the gate stacks by implanting semiconductor impurities in the ILDs may avoid annealing steps that are typically used in straining processes. Drawbacks of annealing, such as dopant diffusion, epitaxial strain loss, and the like, may be avoided, reducing manufacturing costs. Additional cleaning steps may also be avoided, further reducing manufacturing costs.

According to an embodiment, a device includes: a semiconductor fin; a gate stack on the semiconductor fin, the gate stack including a gate dielectric on the semiconductor fin and a gate electrode on the gate dielectric, the gate electrode and the gate dielectric having top surfaces level with one another; and a first inter-layer dielectric (ILD) adjacent the gate stack over the semiconductor fin, the first ILD exerting a compressive strain on the gate stack.

According to an embodiment, a method includes: forming a source/drain region in a semiconductor fin; forming a metal gate adjacent the source/drain region; depositing a first inter-layer dielectric (ILD) on the source/drain region and adjacent the metal gate; depositing a second ILD on the first ILD; implanting a semiconductor impurity in the first ILD or the second ILD; and forming a metal contact through the first ILD and the second ILD, the metal contact coupled to the source/drain region.

According to an embodiment, a method includes: forming semiconductor fins on a substrate; forming metal gates on the semiconductor fins, the metal gates varying in width by less than about 10%; forming a first inter-layer dielectric (ILD) adjacent the metal gates, the first ILD exerting compressive strain on the metal gates; forming a second ILD on the first ILD; and forming first metal contacts through the first ILD and the second ILD, the first metal contacts coupled to the metal gates.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a source/drain region in a semiconductor fin;
   forming a metal gate adjacent the source/drain region;
   depositing a first inter-layer dielectric (ILD) on the source/drain region and adjacent the metal gate;
   planarizing the first ILD such that top surfaces of the first ILD and the metal gate are level;
   after planarizing the first ILD, depositing a second ILD on the first ILD;
   implanting a semiconductor impurity in the first ILD and the second ILD; and
   forming a metal contact through the first ILD and the second ILD, the metal contact coupled to the source/drain region.

2. The method of claim 1, wherein the implanting the semiconductor impurity in the first ILD and the second ILD comprises:
   implanting the semiconductor impurity in the first ILD, the implanting performed at an energy of between about 30 keV and about 40 keV.

3. The method of claim 1, wherein the semiconductor impurity is Si or Ge.

4. The method of claim 1, wherein a concentration of the semiconductor impurity is between about $10^{14}$ cm$^{-3}$ and about $10^{16}$ cm$^{-3}$ after the implanting.

5. The method of claim 1, wherein the implanting the semiconductor impurity in the first ILD and the second ILD comprises:
   implanting the semiconductor impurity in the second ILD, the implanting performed at an energy of between about 15 keV and about 25 keV.

6. The method of claim 5, wherein the implanting the semiconductor impurity in the second ILD comprises implanting the semiconductor impurity to a depth of about 500 Å in the second ILD.

7. A method comprising:
   forming semiconductor fins on a substrate;
   forming dummy gates over the semiconductor fins;
   forming gate spacers adjacent the dummy gates;
   forming source/drain regions in the semiconductor fins, the gate spacers separating the source/drain regions from the dummy gates;
   after forming the gate spacers, forming a first inter-layer dielectric (ILD) over the source/drain regions and adjacent the gate spacers, the first ILD being different from the gate spacers;
   removing the dummy gates to form openings exposing the semiconductor fins;
   forming metal gates in the openings;
   forming a second ILD on the metal gates and the first ILD, the second ILD being different from the gate spacers;
   implanting a semiconductor impurity in the first ILD and the second ILD, wherein after the implanting, the first ILD exerts a compressive strain on the metal gates; and
   forming first metal contacts through the second ILD, the first metal contacts coupled to the metal gates.

8. The method of claim 7, further comprising:
   forming second metal contacts through the first ILD and the second ILD, the second metal contacts coupled to the source/drain regions.

9. The method of claim 7, wherein the semiconductor impurity is Si or Ge.

10. The method of claim 7, wherein after the implanting, the second ILD has a first portion and a second portion, the second portion being disposed under the first portion, the first portion being under a tensile strain, the second portion being under a compressive strain.

11. A method comprising:
    forming a source/drain region in a semiconductor fin;
    forming a gate stack on the semiconductor fin and adjacent the source/drain region;
    depositing a first inter-layer dielectric (ILD) on the gate stack and the source/drain region;
    planarizing the first ILD such that top surfaces of the first ILD and the gate stack are level;
    depositing a second ILD on the first ILD and the gate stack;
    implanting a semiconductor impurity in an upper portion of the second ILD, the density of the upper portion of the second ILD being less than the density of the first ILD after the implanting, the gate stack having a lattice constant of less than 5.431 Å after the implanting;
    forming a first contact through the first ILD and the second ILD, the first contact electrically connected to the source/drain region; and
    forming a second contact through the second ILD, the second contact electrically connected to the gate stack.

12. The method of claim 11, wherein after the implanting, the first ILD exerts a compressive strain on the gate stack.

13. The method of claim 11, wherein the volume of the upper portion of the second ILD after the implanting is greater than the volume of the upper portion of the second ILD before the implanting.

14. The method of claim 11, wherein the distance between the source/drain region and the gate stack after the implanting is greater than the distance between the source/drain region and the gate stack before the implanting.

15. The method of claim 11, wherein the second ILD is a porous dielectric material.

16. The method of claim 11, wherein the density of the upper portion of the second ILD is less than the density of a lower portion of the second ILD after the implanting.

17. The method of claim 16, wherein after the implanting, the upper portion of the second ILD undergoes a tensile strain, and the lower portion of the second ILD undergoes a compressive strain.

18. The method of claim 11, wherein the implanting the semiconductor impurity in the upper portion of the second ILD comprises:
    implanting Si or Ge in the upper portion of the second ILD at an implantation energy of between 15 keV and 25 keV.

19. The method of claim 18, wherein the Si or Ge is not implanted in the first ILD.

20. The method of claim 18, wherein the Si or Ge is implanted to a concentration of between $10^{14}$ cm$^{-3}$ and $10^{16}$ cm$^{-3}$.

* * * * *